United States Patent
Han et al.

(10) Patent No.: US 12,364,106 B2
(45) Date of Patent: Jul. 15, 2025

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Ying Han, Beijing (CN); Ling Wang, Beijing (CN); Yicheng Lin, Beijing (CN); Pan Xu, Beijing (CN); Xing Zhang, Beijing (CN); Guoying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 897 days.

(21) Appl. No.: 17/416,522

(22) PCT Filed: Dec. 29, 2020

(86) PCT No.: PCT/CN2020/140841
§ 371 (c)(1),
(2) Date: Jun. 21, 2021

(87) PCT Pub. No.: WO2021/184907
PCT Pub. Date: Sep. 23, 2021

(65) Prior Publication Data
US 2022/0359635 A1    Nov. 10, 2022

(30) Foreign Application Priority Data

Mar. 20, 2020    (CN) ........................ 202010205098.X

(51) Int. Cl.
*H10K 59/121* (2023.01)
*G09G 3/3225* (2016.01)
(Continued)

(52) U.S. Cl.
CPC ....... *H10K 59/1213* (2023.02); *H10K 50/818* (2023.02); *H10K 59/131* (2023.02);
(Continued)

(58) Field of Classification Search
CPC ............... H10K 59/1213; H10K 59/60; H10K 59/80518; H10K 59/13; H10K 50/818
See application file for complete search history.

(56) References Cited

U.S. PATENT DOCUMENTS

2012/0267611 A1    10/2012  Chung et al.
2019/0006441 A1*   1/2019  Ling ................. H01L 27/14612
(Continued)

FOREIGN PATENT DOCUMENTS

CN    109065582 A  * 12/2018 ........... H01L 27/322
CN    109285870 A    1/2019
(Continued)

OTHER PUBLICATIONS

International Search Report for PCT/CN2020/140841 Mailed Mar. 25, 2021.
(Continued)

*Primary Examiner* — Antonio B Crite
(74) *Attorney, Agent, or Firm* — Ling Wu; Stephen Yang; Ling and Yang Intellectual Property

(57) ABSTRACT

Provided is a display substrate, including: a substrate, and multiple light-emitting units and multiple light-detecting units located on a substrate. At least one light-emitting unit includes a light-emitting element and a pixel driving circuit coupled with the light-emitting element, and at least one light-detecting unit includes an optical sensing element and a light-emitting detection circuit coupled with an optical sensing element; an optical sensing element is located on one side of a light-emitting detection circuit and a pixel driving circuit away from a substrate and between a light-
(Continued)

emitting element and a substrate; the light-emitting element emits light from a side away from the substrate, and a light transmittance region is provided on one side of the light-emitting element facing the optical sensing element.

16 Claims, 11 Drawing Sheets

(51) Int. Cl.
| | |
|---|---|
| *H10K 50/818* | (2023.01) |
| *H10K 59/12* | (2023.01) |
| *H10K 59/13* | (2023.01) |
| *H10K 59/131* | (2023.01) |
| *H10K 59/60* | (2023.01) |
| *H10K 59/80* | (2023.01) |
| *H10K 71/00* | (2023.01) |

(52) U.S. Cl.
CPC ....... *H10K 59/60* (2023.02); *H10K 59/80518* (2023.02); *H10K 71/00* (2023.02); *H10K 59/1201* (2023.02)

(56) References Cited

U.S. PATENT DOCUMENTS

| | | |
|---|---|---|
| 2020/0044004 A1 | 2/2020 | Wang et al. |
| 2021/0280645 A1 | 9/2021 | Wang et al. |
| 2021/0335917 A1 | 10/2021 | Wang |

FOREIGN PATENT DOCUMENTS

| | | |
|---|---|---|
| CN | 110047906 A | 7/2019 |
| CN | 110164946 A | 8/2019 |
| CN | 110660356 A | 1/2020 |
| CN | 111370458 A | 7/2020 |

OTHER PUBLICATIONS

The First Office Action dated Jun. 17, 2022 for Chinese Patent Application No. 202010205098.X and English Translation.

* cited by examiner

DISPLAY SUBSTRATE AND PREPARATION METHOD THEREOF, AND DISPLAY APPARATUS

The present application claims the priority of Chinese patent application No. 202010205098.X, filed to the CNIPA on Mar. 20, 2020 and entitled "Display Substrate, Preparation Method Thereof, and Display Apparatus", the content of which should be regarded as being incorporated herein by reference.

TECHNICAL FIELD

The present disclosure relates to, but is not limited to, the field of display technology, in particular to a display substrate and a preparation thereof, and a display apparatus.

BACKGROUND

An organic light-emitting diode (OLED) display has advantages such as low energy consumption, self-luminescence, good temperature characteristics, high response speed, flexibility, ultra-thinness and low cost. The OLED has been widely used in display fields, including mobile phones, tablet computers, digital cameras and so on, attracting growing attention.

SUMMARY

The following is a summary of subject matter described in detail herein. This summary is not intended to limit the protection scope of the claims.

The present disclosure provides a display substrate and a preparation method thereof, and a display apparatus.

In one aspect, the present disclosure provides a display substrate, including a substrate, and multiple light-emitting units and multiple light-detecting units located on the substrate; at least one light-emitting unit includes a light-emitting element and a pixel driving circuit coupled with the light-emitting element, and at least one light-detecting unit includes an optical sensing element and a light-emitting detection circuit coupled with the optical sensing element; the optical sensing element is located on one side of the light-emitting detection circuit and the pixel driving circuit away from the substrate and between the light-emitting element and the substrate; the light-emitting element emits light from a side away from the substrate, a light transmittance region is provided on one side of the light-emitting element facing the optical sensing element, and an orthographic projection of the light transmittance region on the substrate at least partially coincides with an orthographic projection of the optical sensing element on the substrate.

In another aspect, the present disclosure provides a display apparatus, including the display substrate described above.

In another aspect, the present disclosure provides a method for preparing a display substrate, including: forming a pixel driving circuit of a light-emitting unit and a light-emitting detection circuit of a light-detecting unit on a substrate; forming an optical sensing element of a light-detecting unit on the pixel driving circuit and the light-emitting detection circuit, wherein the optical sensing element is coupled with the light-emitting detection circuit; forming a light-emitting element of the light-emitting unit on the optical sensing element, wherein the light-emitting element is coupled with the pixel driving circuit; the light-emitting element emits light from a side away from the substrate, a light transmittance region is provided on one side of the light-emitting element facing the optical sensing element, and an orthographic projection of the light transmittance region on the substrate at least partially coincides with an orthographic projection of the optical sensing element on the substrate.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain the technical solutions of the present disclosure and do not constitute a limitation on the technical solutions of the present disclosure.

DETAILED DESCRIPTION

Figure 1:
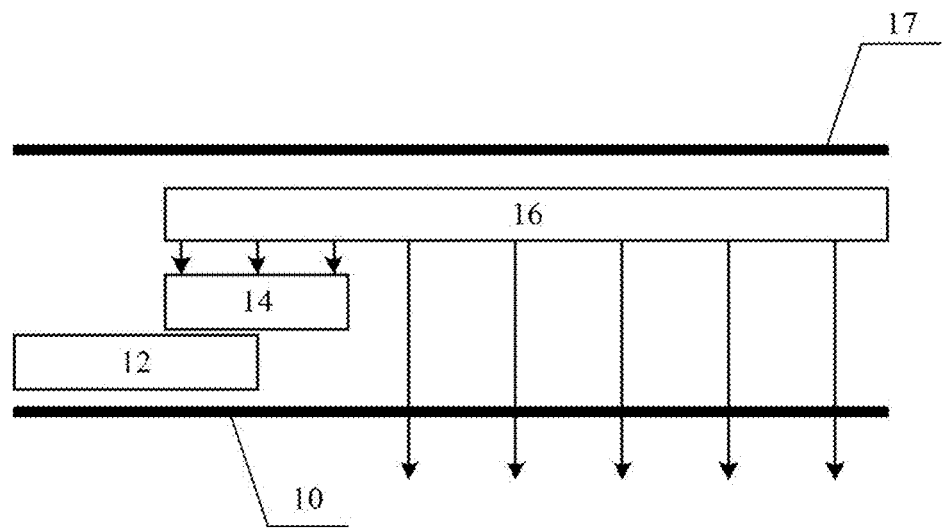
FIG. 1 is a schematic diagram of a structure of bottom emission type of OLED display substrate.

Multiple embodiments are described in the present disclosure, but the description is exemplary rather than restrictive, and it is apparent to those of ordinary skills in the art that there may be more embodiments and implementation solutions within the scope of the embodiments described in the present disclosure. Although many possible combinations of features are shown in the drawings and discussed in the embodiments, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skilled in the art. The disclosed embodiments, features and elements of the present disclosure may be combined with any conventional features or elements to form a unique technical solution defined by the claims. Any feature or element of any embodiment may also be combined with features or elements from other technical solutions to form another unique technical solution defined by the claims. Therefore, it should be understood that any of the features shown and discussed in the present disclosure may be implemented individually or in any suitable combination. Therefore, the embodiments are not otherwise limited except in accordance with the appended claims and equivalents thereof. In addition, one or more modifications and alterations may be made within the protection scope of the appended claims.

Furthermore, when describing representative embodiments, the specification may have presented a method or process as a specific order of acts. However, to the extent that the method or process does not depend on the specific order of steps described herein, the method or process should not be limited to the specific order of steps described. As those of ordinary skills in the art will understand, other orders of steps are also possible. Therefore, the specific order of steps set forth in the specification should not be interpreted as limiting the claims. Furthermore, the claims for the method or process should not be limited to performing the acts in the order of its acts, and those skilled in the art may easily understand that these orders may be varied but still remain within the essence and scope of the embodiments of the present disclosure.

Hereinafter, embodiments will be described with reference to the drawings. The embodiments may be implemented in a number of different forms. Those of ordinary skills in the art may readily understand the fact that implementations and contents may be transformed into different forms without departing from the essence and scope of the present disclosure. Therefore, the present disclosure should not be construed as being limited only to what is described in the following embodiments.

In the drawings, the size of each constituent element, or the thickness or area of a layer, is sometimes exaggerated for clarity. Therefore, an implementation of the present disclosure is not necessarily limited to the size shown, and a shape and size of each component in the drawings do not reflect true proportions. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation. In the present disclosure, "multiple" means two or more than two.

In the present disclosure, for the sake of convenience, wordings such as "central", "upper", "lower", "front", "rear", "vertical", "horizontal", "top", "bottom", "inner", "outer" and the others describing the orientations or positional relations are used to depict relations of elements with reference to the drawings, which are only for an easy and simplified description of the present disclosure, rather than for indicating or implying that the device or element referred to must have a specific orientation, or must be constructed and operated in a particular orientation and therefore, those wordings cannot be construed as limitations on the present disclosure. It may be understood that when an element such as a layer, film, region or substrate is referred to as being "on" or "under" another element, the element may be "directly" "on" or "under" the another element, or there may be a middleware. The positional relations of each of the constituent elements may be appropriately changed according to the direction in which constituent elements are described. Therefore, the wordings are not limited in the specification, and may be replaced appropriately according to situations.

In the present disclosure, similar terms such as "connect", "couple" or "link" are not limited to physical or mechanical connections, but may include direct or indirect electrical connections. "Electrical connection" includes a case where constituent elements are connected together through an element with certain electrical effects. The "element with a certain electric action" is not particularly limited as long as it can transmit and receive electrical signals between the connected constituent elements. Examples of the "element having a certain electrical action" not only include electrodes and wirings, but also include switching elements such as transistors, resistors, inductors, capacitors, and other elements with one or more functions.

In the present disclosure, "parallel" refers to a state in which an angle formed by two straight lines is greater than or equal to −10° and less than or equal to 10°, and thus also includes a state in which the angle is greater than or equal to −5° and less than or equal to 5°. In addition, "perpendicular" refers to a case where an angle formed by two straight lines is above −80° and below 100°, and thus also includes a case where the angle is above −85° and below 95°.

In the present disclosure, "film" and "layer" are interchangeable. For example, sometimes "conductive layer"

may be replaced with "conductive film". Similarly, "insulating film" may sometimes be replaced with "insulating layer".

In the present disclosure, for example, when the conductivity is sufficiently low, a "semiconductor" can share the characteristics of an "insulator". In addition, since the boundary between "semiconductor" and "insulator" unclear, it is sometimes impossible to accurately distinguish "semiconductor" from "insulator". Therefore, "semiconductor" in the present disclosure may sometimes be replaced with "insulator". Similarly, "insulator" in the present disclosure may sometimes be replaced with "semiconductor". In addition, "insulator" in the present disclosure may sometimes be replaced with "semi-insulator".

In the present disclosure, for example, when the conductivity is sufficiently high, a "semiconductor" can share the characteristics of a "conductor". In addition, since the boundary between "semiconductor" and "conductor" unclear, it is sometimes impossible to accurately distinguish "semiconductor" from "conductor". Therefore, "semiconductor" in the present disclosure may sometimes be replaced with "conductor". Similarly, "conductor" in the present disclosure may sometimes be replaced with "semiconductor".

In the present disclosure, a transistor refers to an element including at least three terminals, namely, a gate electrode, a drain electrode and a source electrode. The transistor has a channel region between the drain electrode (a drain electrode terminal, a drain electrode region or a drain electrode) and the source electrode (a source electrode terminal, a source electrode region or a source electrode), and current can flow through the drain electrode, the channel region and the source electrode. Notice that in the present disclosure, a channel region refers to a region through which the current mainly flows.

Functions of the "source electrode" and the "drain electrode" are sometimes interchangeable in a case where transistors with opposite polarities are used or in a case where the current direction changes during circuit operation. Therefore, in the present disclosure, "the source electrode" and "the drain electrode" are interchangeable.

Those skilled in the art may understand that switch transistors and driving transistors used in all embodiments of the present disclosure may be thin film transistors or field-effect transistors or other devices with same characteristics. Exemplarily, the thin film transistor used in the embodiments of the present disclosure may be an oxide semiconductor transistor. Since a source electrode and a drain electrode of a switch transistor used here are symmetrical, the source electrode and the drain electrode may be interchanged. In the embodiments of the present disclosure, a control electrode is a gate electrode; one of two electrodes of the switch transistor other than a gate electrode is referred to as a first electrode and the other electrode is referred to as a second electrode to distinguish the two electrodes. The first electrode may be a source electrode or a drain electrode, and the second electrode may be a drain electrode or a source electrode.

OLED brightness compensation methods may be categorized into electrical compensation and optical compensation. Electrical compensation may compensate for the threshold voltage and mobility changes, while optical compensation may compensate for more factors causing uneven brightness without distinguishing the causes of brightness changes. In an optical compensation mode, a light-emitting detection circuit may detect the light-emitting signal of an OLED device through an optical sensing element to compensate the brightness of the OLED device according to the brightness signal. Currently, OLED display substrates with optical compensation mode all adopt a bottom emission structure.

FIG. 1 is a schematic diagram of a structure of bottom emission type of OLED display substrate. As shown in FIG. 1, a circuit structure 12, an optical sensing element 14, and a light-emitting element 16 are disposed on a substrate 10, which are all located under the cover plate 17; the light-emitting element 16 emits light from one side of the substrate 10; wherein, the circuit structure 12 includes a pixel driving circuit coupled with the light-emitting element 16 and a light-emitting detection circuit coupled with the optical sensing element 14. It may be seen from FIG. 1 that, the circuit structure 12 needs to occupy a part of an opening region of the light-emitting element 16, which restricts the pixel aperture ratio and pixels per inch (PPI) of the bottom emission type of OLED display substrate; in addition, the optical sensing element 14 needs to receive the light emitted by the light-emitting element 16, and the light receiving region of the optical sensing element 14 will occupy an additional part of the opening region of the light-emitting element 16, which further restricts the pixel aperture ratio and display resolution of the bottom emission type of OLED display substrate.

Embodiments of the present disclosure provide a display substrate, a method for preparing the display substrate, and a display apparatus, and by designing a display substrate with a top emission structure, an optical compensation can be achieved, and the pixel aperture ratio and display resolution of the display substrate can be greatly improved.

An embodiment provides a display substrate, which includes: a substrate, and multiple light-emitting units and multiple light-detecting units located on a substrate; at least one light-emitting unit includes a light-emitting element and a pixel driving circuit coupled with the light-emitting element, and at least one light-detecting unit includes an optical sensing element and a light-emitting detection circuit coupled with an optical sensing element; wherein, an optical sensing element is located on one side of a light-emitting detection circuit and a pixel driving circuit away from a substrate and between a light-emitting element and a substrate; a light-emitting element emits light from a side away from a substrate, a light transmittance region is provided on one side of a light-emitting element facing a optical sensing element, and an orthographic projection of a light transmittance region on a substrate at least partially coincides with an orthographic projection of a optical sensing element on a substrate.

Figure 2:
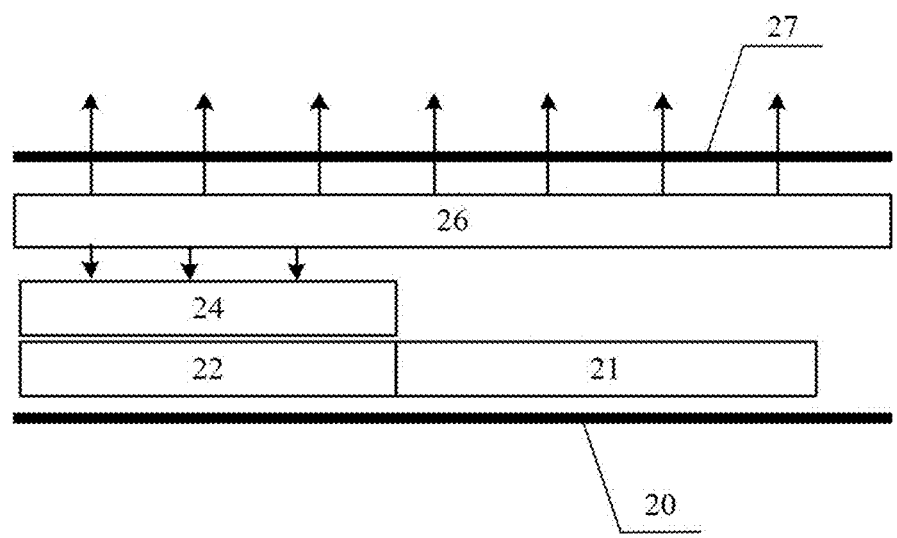
FIG. 2 is a schematic diagram of a structure of a display substrate according to an embodiment of the present disclosure.

FIG. 2 is a schematic diagram of a structure of a display substrate according to an embodiment of the present disclosure. As shown in FIG. 2, a pixel driving circuit 21 and a light-emitting detection circuit 22 are disposed on a substrate 20, an optical sensing element 24 is located on one side of the pixel driving circuit 21 and the light-emitting detection circuit 22 away from the substrate 20, an light-emitting element 26 is located above the optical sensing element 24, and a cover plate 27 is located above the light-emitting element 26; the light-emitting element 26 emits light from a side away from the substrate 20, a light transmittance region is provided on one side of the light-emitting element 26 facing the optical sensing element 24, and an orthographic projection of the light transmittance region on the substrate at least partially coincides with an orthographic projection of the optical sensing element 24 on the substrate 20. In this way, an optical sensing element 24 located below a light-emitting element 26 may receive the light emitted by the light-emitting element 26, so that a light-emitting detection circuit 22 may detect the brightness signal of the light-emitting element 26 through the optical sensing element 24 and compensate the brightness of the light-emitting element 26 according to the brightness signal.

As shown in FIG. 2, a light-emitting element 26 emits light upward (i.e., emits light from a side away from the substrate 20) to achieve display, and a part of the light emitted downward by the light-emitting element 26 (i.e., the side facing the substrate 20) may be provided to an optical sensing element 24 so that the optical sensing element 24 may detect the luminous brightness, and the rest of the light may be directly reflected back to the upper surface of the light-emitting element 26 for display.

The display substrate with the top emission structure provided in the embodiment may greatly improve the pixel aperture ratio and display resolution to support better display effect.

In an exemplary embodiment, an orthographic projection of a light transmitting region on a substrate completely coincides with an orthographic projection of an optical sensing element on the substrate.

In an exemplary embodiment, a light-emitting element may include a first anode, a light-emitting functional layer, and a first cathode which are sequentially stacked in a direction away from a substrate; a first cathode is made of light transmittance material; a first anode includes a reflective layer and a light transmittance layer, wherein a light transmittance region is formed by a light transmittance layer and a reflective layer. An orthogonal projection of a light transmittance layer on the substrate at least partially coincides with an orthogonal projection of an optical sensing element on the substrate, and the coinciding region is a photosensitive region of an optical sensing element to an light-emitting element. In this exemplary embodiment, by patterning the anode of the light-emitting element, and a light transmittance design is achieved in a region where the first anode of the light-emitting element corresponds to the optical sensing element, and part of the region where the light-emitting element faces the optical sensing element is translucent, so that the optical sensing element may receive the light emitted by the light-emitting element without occupying the opening region of the light-emitting unit.

In an exemplary embodiment, an orthographic projection of a light transmittance layer on a substrate covers an orthographic projection of a reflective layer on the substrate, and a region of the light transmittance layer not shielded by the reflective layer forms a light transmittance region. However, this is not limited in the embodiment of the present disclosure. For example, an orthographic projection of a light transmittance layer on the substrate and an orthographic projection of a reflective layer on the substrate may only partially coincide.

In an exemplary embodiment, a light transmittance layer may be located on one side of a reflective layer away from a substrate, or a reflective layer may be located on one side of a light transmittance layer away from a substrate. However, this is not limited in the embodiment of the present disclosure.

In an exemplary embodiment, an optical sensing element may include a second cathode, a photoelectric conversion structure, and a second anode which are sequentially stacked along a direction away from a substrate; wherein the second cathode is made of light-shielding material and the second anode is made of light-transmitting material. In an example, an optical sensing element may be a PIN type photodiode. However, this is not limited in the embodiment of the present disclosure.

In an exemplary embodiment, a display substrate may further include a first planarization layer located between an optical sensing element and a light-emitting detection circuit. In this exemplary embodiment, by providing a first planarization layer below an optical sensing element, the usability of the optical sensing element based on a high level difference at the bottom can be ensured.

In an exemplary embodiment, a display substrate may further include a first passivation layer and a second passivation layer; the first passivation layer is located between a light-emitting detection circuit and a first planarization layer, and the second passivation layer is located between a first planarization layer and an optical sensing element. In this exemplary embodiment, by providing passivation layers on both sides of the first planarization layer, the influence of the first planarization layer on other films and structures may be blocked.

In an exemplary embodiment, multiple light-emitting units and light-detecting units may have a one-to-one correspondence or multiple-to-one correspondence. One light-emitting unit may be optically compensated by one light-detecting unit, or multiple light-emitting units may be optically compensated by one multiplexing light-detecting unit.

The following elaborately describes the technical solutions of the embodiments of the present disclosure through examples.

Figure 3:
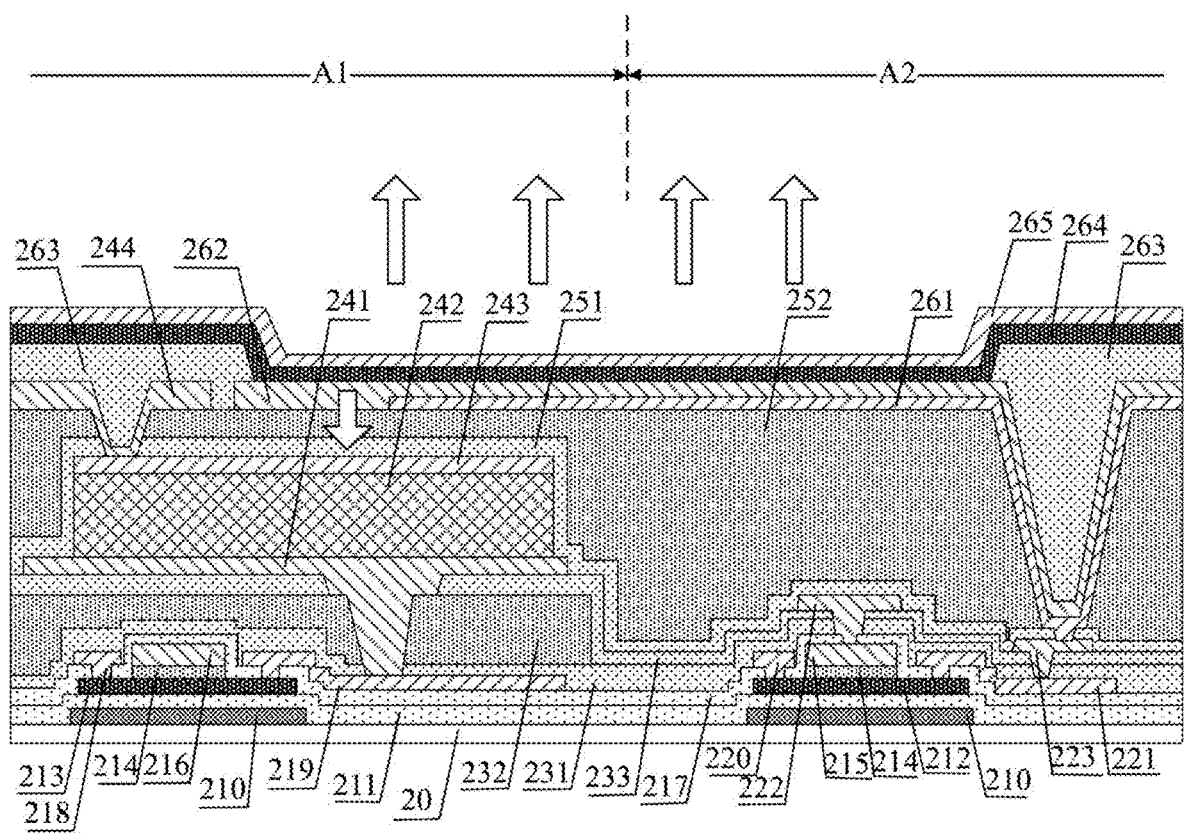
FIG. 3 is a schematic diagram of a structure of a partial sectional view of a display substrate according to an embodiment of the present disclosure.

FIG. 3 is a schematic diagram of a structure of a partial sectional view of a display substrate according to an embodiment of the present disclosure. As shown in FIG. 3, on a plane perpendicular to a display substrate, at least one light-emitting unit includes a pixel driving circuit and a light-emitting element which are sequentially disposed on a substrate 20, wherein the pixel driving circuit includes multiple thin film transistors, which may be of 2T1C, 3T1C or 7T1C design; herein, only one light-emitting element and one thin film transistor are exemplified in FIG. 3; at least one light-detecting unit includes a light-emitting detection circuit and an optical sensing element sequentially disposed on the substrate 20. In FIG. 3, the light-emitting detection circuit and the optical sensor are located in a first region A1 on the left side, and the pixel driving circuit is located in a second region A2 on the right side; the light-emitting detection circuit and the pixel driving circuit are prepared and formed synchronously.

In this embodiment, a pixel driving circuit may adopt a 3T1C design, and a light-emitting detection circuit may adopt a 1T1C design. However, this is not limited in the embodiment of the present disclosure.

Figure 4:
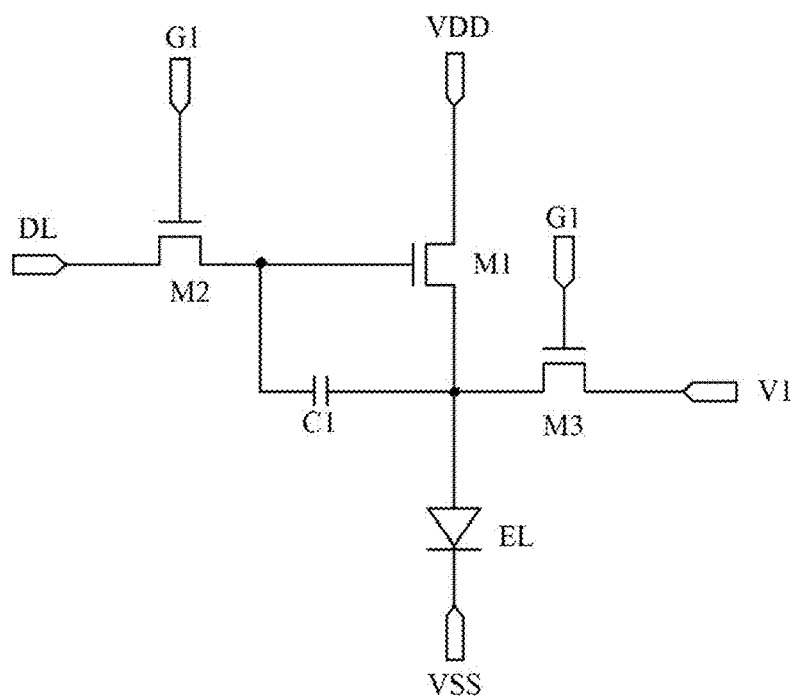
FIG. 4 is a schematic diagram of a structure of a pixel driving circuit according to an embodiment of the present disclosure.

FIG. 4 is a schematic diagram of a structure of a pixel driving circuit according to an embodiment of the present disclosure. As shown in FIG. 4, a pixel driving circuit according to an exemplary embodiment may include: a driving transistor M1, a first switch transistor M2, a second switch transistor M3, and a first storage capacitor C1. A gate electrode of the first switch transistor M2 is coupled with a first scanning signal wire G1, a first electrode of the first switch transistor M2 is coupled with a data signal wire DL, and the second electrode of the first switch transistor M2 is coupled with a gate electrode of the driving transistor M1; a first electrode of the driving transistor M1 is coupled with a first power supply line VDD, and a second electrode of the driving transistor M1 is coupled with a first anode of a light-emitting element EL; a first cathode of the light-emitting element EL is coupled with a second power supply terminal VSS; a control electrode of the second switch transistor M3 is coupled with a first scanning signal wire G1, a first electrode of the second switch transistor M3 is coupled with a first reference signal wire V1, and a second electrode of the second switch transistor M3 is coupled with a second electrode of the driving transistor M1; a first electrode of the first storage capacitor C1 is coupled with a control electrode of the driving transistor M1, and a second electrode of the first storage capacitor C1 is coupled with a second electrode of the driving transistor M1.

Figure 5:
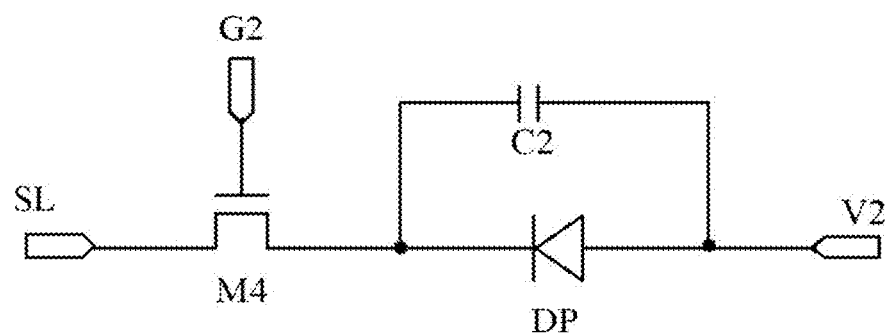
FIG. 5 is a schematic structural diagram of an light-emitting detection circuit according to an embodiment of the present disclosure.

FIG. 5 is a schematic structural diagram of a light-emitting detection circuit according to an embodiment of the present disclosure. As shown in FIG. 5, a light-emitting detection circuit includes: a third switch transistor M4 and a second storage capacitor C2. A control electrode of the third switch transistor M4 is coupled with a second scanning signal wire G2, a first electrode of the third switch transistor M4 is coupled with a detection signal wire SL, and a second electrode of the third switch transistor M4 is coupled with a second cathode of an optical sensing element DP; a first electrode of the second storage capacitor C2 is coupled with a second cathode of the optical sensing element DP, a second electrode of the second storage capacitor C2 is coupled with a second anode of the optical sensing element DP, and the second storage capacitor C2 is configured to store electrical signals converted by the optical sensing element DP; a second anode of the optical sensing element DP is coupled with a second reference signal wire V2. In the present example, the optical sensing element DP may be a PIN type photodiode. However, this is not limited in the embodiment of the present disclosure.

Figure 6:
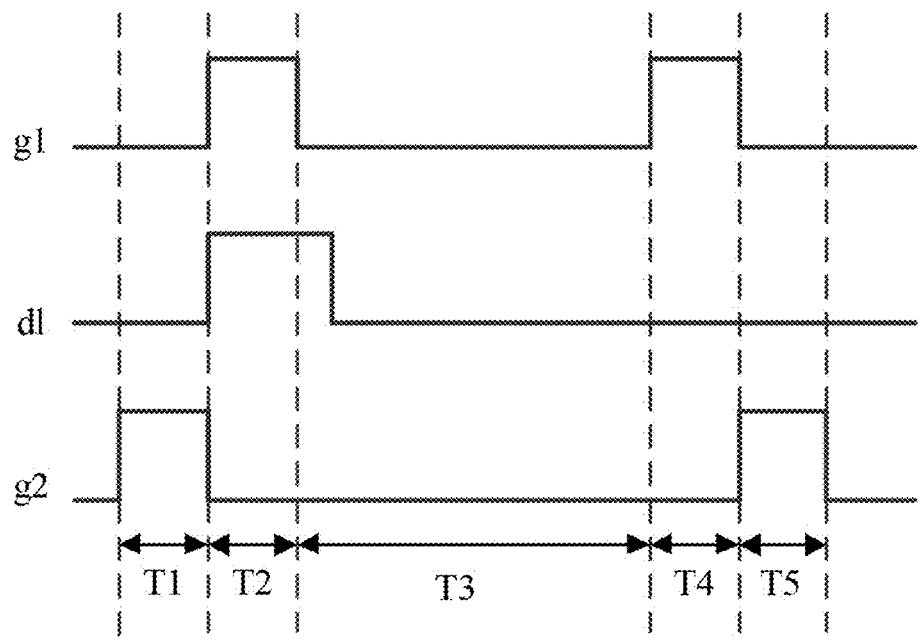
FIG. 6 is a sequence chart of a display substrate according to an embodiment of the present disclosure.

The operation process of a display substrate provided in the present embodiment is illustrated below by taking the pixel driving circuit and the light-emitting detection circuit shown in FIG. 4 and FIG. 5 as examples. FIG. 6 is a sequence chart of a display substrate according to the present embodiment. Here is an example where the switch transistors M2 to M4 and the driving transistor M1 in the circuit according to an the present embodiment are all N-type thin film transistors. The N-type switch transistor is conducted when the gate electrode is at a high level and cut-off when the gate electrode is at a low level. However, this is not limited in the embodiment of the present disclosure. The switch and drive transistors in the disclosed embodiments may also be P-type transistors The P-type switch transistor is conducted when the gate electrode is at a low level and cut-off when the gate electrode is at a high level.

As shown in FIG. 6, a display substrate according to the embodiment may be optically compensated through the following five operation stages.

In a first stage T1 (i.e., the reset stage), a third switch transistor M4 is conducted under the control of the high level of a signal g2 of a second scanning signal wire G2 to conduct a second cathode of an optical sensing element DP and a detection signal wire SL, so that a positive voltage is applied to the second cathode of the optical sensing element DP; A negative voltage is applied to a reference signal wire V2 (e.g., 5v), so that a negative voltage is applied to the second anode of the optical sensing element DP, and the optical sensing element DP works in a reversebias state. In addition, the first switch transistor M2 and the second switch transistor M3 are cut-off under a low level control of a signal g1 of a first scanning signal wire G1.

In a second stage T2 (i.e., a input writing stage), a first switch transistor M2 and a second switch transistor M3 are conducted under a high level control of the signal g1 of the first scanning signal wire G1; the first switch transistor M2 supplies a signal d1 (data voltage Vdata) provided by the data signal wire DL to a control electrode of the driving transistor M1, so that the voltage of the gate electrode voltage of the driving transistor M1 is Vdata and is stored by the first storage capacitor C1; the second switch transistor M3 supplies a reference voltage signal (e.g., 0 V) transmitted on a first reference signal wire V1 to a light-emitting element EL, and a voltage value of the reference voltage signal is smaller than a voltage value of the signal of the second power supply terminal VSS, so that the light-emitting element EL is in a reversebias state. In addition, the third switch transistor M4 is cut-off under a low level control of a signal g2 of a second scanning signal wire G2.

In a third stage T3 (i.e., the display stage), the first switch transistor M2 and the second switch transistor M3 are cut-off under a low level control of the signal g1 of the first scanning signal terminal G1, and the third switch transistor M4 is cut-off under a low level control of the signal g2 of the second scanning signal terminal G2. A driving transistor M1 generates a driving current I under the common control of the voltage of a gate electrode voltage and a source electrode voltage thereof, and the driving current I meets the following formula: I=K[Vgs−Vth]2=k [Vdata−Vs−Vth] 2; in which Vs is a voltage of a source electrode of the driving transistor M1, Vth is the threshold voltage of the driving transistor M1, and K is a fixed constant related to the process parameters and geometric dimensions of the driving transistor M1. The source electrode voltage Vs of the driving transistor M1 may be the voltage value of the reference voltage signal transmitted on the first reference signal wire V1.

At this stage, the driving current I generated by the driving transistor M1 may drive the light-emitting element EL to emit light, so that the optical sensing element DP may receive the light emitted by the light-emitting element EL and convert the received light into current, and thereby changing the voltage of the second cathode of the optical sensing element DP.

In a fourth stage T4 (i.e., the display off stage), the first switch transistor M2 and the second switch transistor M3 are conducted under a high level control of the signal g1 of the first scanning signal wire G1; the conducted first switch transistor M2 provides the signal d1 (data voltage of 0 V) provided by the data signal wire DL to the control electrode of the driving transistor M1, and the conducted second switch transistor M3 provides the reference voltage signal (e.g., 0 V) transmitted on the first reference signal wire V1 to the light-emitting element EL, so that the light-emitting element EL stops emitting light, and thereby ensuring that the voltage of the second cathode of the optical sensor element PD is stable.

In a fifth stage T5 (i.e., the optical detection stage), the third switch transistor M4 is conducted under a high level control of the signal g2 of the second scanning signal wire G2 to conduct the optical sensing element DP and the detection signal wire SL, so that the voltage of the second cathode of the optical sensing element DP is transmitted to the detection signal wire SL. The voltage on the detection signal wire SL is acquired by the driving integrated circuit (IC) for analysis and compensation calculation, so as to improve the picture display effect.

Based on the pixel driving circuit shown in FIG. 4, electrical compensation may also be achieved by coupling the first electrode of the second switch transistor M3 to a detection signal wire. However, this is not limited in the embodiment of the present disclosure.

In this embodiment, a thin film transistor in the second region A2 illustrated in FIG. 3 may be a driving transistor M1 in a pixel driving circuit shown in FIG. 4. As shown in FIG. 3, a driving transistor M1 includes a first active layer 212, a first gate electrode 215, a first source electrode 221, a first drain electrode 220, a first connection electrode 223 and a second connection electrode 222; an light-emitting element includes a first anode, a pixel defining layer 263, a light-emitting functional layer 264 and a first cathode 265, wherein the first anode includes a reflective layer 261 and a light transmittance layer 262; the reflective layer 261 of the first anode is coupled with the first connection electrode 223, which is coupled with the first source electrode 221 of the driving transistor M1, so as to achieve the coupling between the first anode and the first source electrode 221 of the driving transistor M1.

In this embodiment, a thin film transistor in the first region A1 shown in FIG. 3 may be a third switch transistor M4 in the light-emitting detection circuit shown in FIG. 5. As shown in FIG. 3, a third switch transistor M4 includes a second active layer 213, a second gate electrode 216, a second source electrode 219 and a second drain electrode 218; an optical sensing element includes a second cathode 241, a photoelectric conversion structure 242, a second anode 243 and a third connection electrode 244; and the second cathode 241 is coupled with the second source electrode 219 of the third switch transistor M4.

In this embodiment, the structure of a thin film transistor in a pixel driving circuit and the structure of a thin film transistor in a light-emitting detection circuit may be the same, and synchronously prepared by the same process.

As shown in FIG. 3, a light-emitting element emits light from a side away from a substrate 20, and the light-emitting element transmits light to a side of an optical sensing element through a light transmittance region formed by a light transmittance layer 262 and a reflective layer 261, so that the optical sensing element may receive the light emitted by the light-emitting element to detect the brightness for optical compensation.

The technical solution of the present embodiment is further described below through a process for preparing the display substrate in the present embodiment. A "patterning process" mentioned in the embodiment includes deposition of a film layer, coating of photoresist, mask exposure, development, etching, stripping of photoresist, etc., and may adopt a known mature preparation process. Deposition may be performed by using a known process such as sputtering, evaporation, chemical vapor deposition, or the like, coating may be performed by using a known coating process, and etching may be performed by using a known method, which is not limited here. In the description of the present embodiment, it should be understood that "thin film" refers to a layer of thin film made of a certain material by deposition or another process on the base substrate.

The process for preparing a display substrate according to the present exemplary embodiment may include following acts (1) to (14).

(1) Forming a Pattern of a Shield Layer on a Substrate

Figure 7:
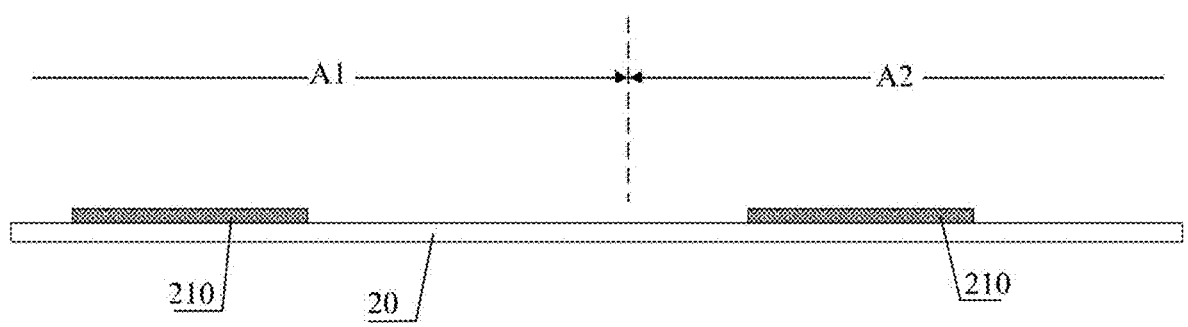
FIG. 7 is a schematic diagram after formation of a pattern of a shield layer according to an embodiment of the present disclosure.

Forming a pattern of a shield layer includes: depositing a shield film on a substrate 20, and patterning the shield film through a patterning process to form a pattern of a shield layer 210 on the substrate 20, as shown in FIG. 7. The shield layer 210 may be disposed at the corresponding position of each thin film transistor, and the shield layer 210 may effectively absorb and shield ambient light.

The substrate 20 may be a flexible substrate made of a material such as polyimide (PI), polyethylene terephthalate (PET), or a surface-treated polymer soft film.

(2) Forming a Pattern of an Active Layer

Figure 8:
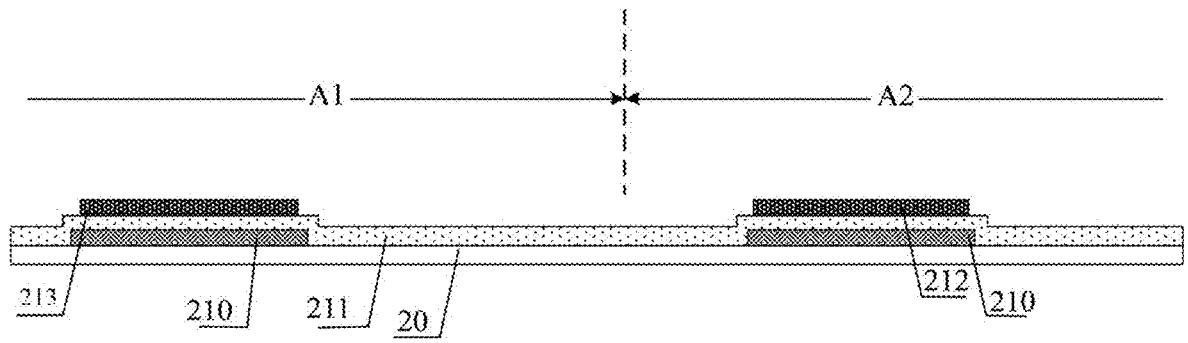
FIG. 8 is a schematic diagram after formation of a pattern of an active layer according to an embodiment of the present disclosure.

Forming a pattern of an active layer includes: sequentially depositing a first insulating film and an active film on the substrate 20 on which the above patterns are formed, and patterning the active film through a patterning process to form a first insulating layer 211 covering the shield layer 210, and a first active layer 212 and a second active layer 213 which are formed on a first active layer 211, as shown in FIG. 8. The first active layer 212 serves as an active layer of the driving transistor M1, and the second active layer 213 serves as an active layer of the third switch transistor M4.

The first insulating thin film may be made of silicon oxide (SiOx), silicon nitride (SiNx), silicon oxynitride (SiON), etc., or a material of high dielectric constant High k such as aluminum oxide (AlOx), hafnium oxide (HfOx), tantalum oxide (TaOx), etc., and may be a single layer, multiple layers, or a composite layer. Generally, the first insulating layer 211 is referred to as a buffer layer.

The active film may be made of one or multiple kinds of materials such as amorphous indium gallium zinc Oxide (a-IGZO), zinc oxynitride (ZnON), indium zinc tin oxide (IZTO), amorphous silicon (a-Si), polysilicon (p-Si), sexithiophene or polythiophene, that is, the present embodiment is applicable to a top gate thin film transistor (TFT)-based display substrate manufactured based on an Oxide technology, a silicon technology and an organic technology.

(3) Forming a Pattern of a Gate Electrode

Figure 9:
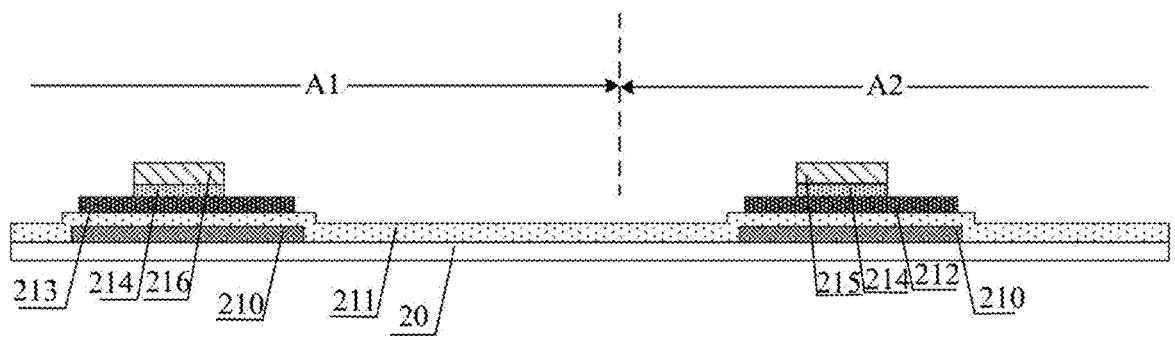
FIG. 9 is a schematic diagram after formation of a pattern of a gate electrode according to an embodiment of the present disclosure.

Forming a pattern of a gate electrode includes: sequentially depositing a second insulating film and a first metal film on the substrate 20 on which the aforementioned patterns are formed; first coating a layer of photoresist on the first metal film, and forming a photoresist pattern through masking, exposing and developing, after etching the first metal film through an etching process, etching with self-alignment the second insulating film downward using the first metal film as a mask to form a pattern of a second insulating layer 214, and the pattern of a first gate electrode 215, a second gate electrode 216, and a scan signal wire (not shown) disposed on the second insulating layer 214, as shown in FIG. 9.

Herein, the first metal film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be a stacked structure formed by a metal and a translucent conductive material, such as indium tin oxide (ITO)/argentum (Ag)/indium tin oxide (ITO).

The second insulating film may be made of silicon oxide (SiOx), silicon nitride (SiNx) and silicon oxynitride (SiON), or may be made of a high k material such as aluminum oxide (AlOx), hafnium oxide (HfOx), tantalum oxide (TaOx), or the like, and may be of a single layer, multiple layers, or a composite layer. Generally, the second insulating layer 214 is referred to as a gate insulating (GI) layer.

(4) Forming a Pattern of a Third Insulating Layer

Figure 10:
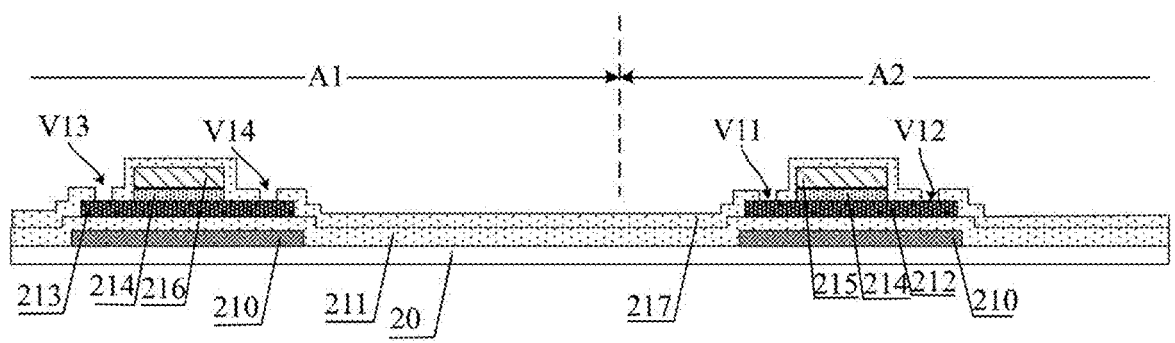
FIG. 10 is a schematic diagram after formation of a pattern of a third insulating layer according to an embodiment of the present disclosure.

Forming a pattern of a third insulating layer includes: depositing a third insulating film on the substrate 20 on which the aforementioned patterns are formed, depositing the third insulating film, and patterning the third insulating film through a patterning process to form a pattern of the third insulating layer 217 covering the aforementioned structure; the third insulating layer 217 is provided with multiple vias, which are the first vias V11 and V12 exposing the two terminals of the first active layer 212 and the second vias V13 and V14 exposing the two terminals of the second active layer 213, as shown in FIG. 10.

Herein, the third insulating layer may be made of silicon oxide (SiOx), silicon nitride (SiNx), silicon oxynitride (SiON), etc., or a material of High k such as aluminum oxide (AlOx), hafnium oxide (HfOx), tantalum oxide (TaOx), etc., and may be a single layer, multiple layers, or a composite layer. Generally, the third insulating layer 217 is referred to as an interlayer insulating (ILD) layer.

(5) Forming Patterns of a Source Electrode and a Drain Electrode

Figure 11:
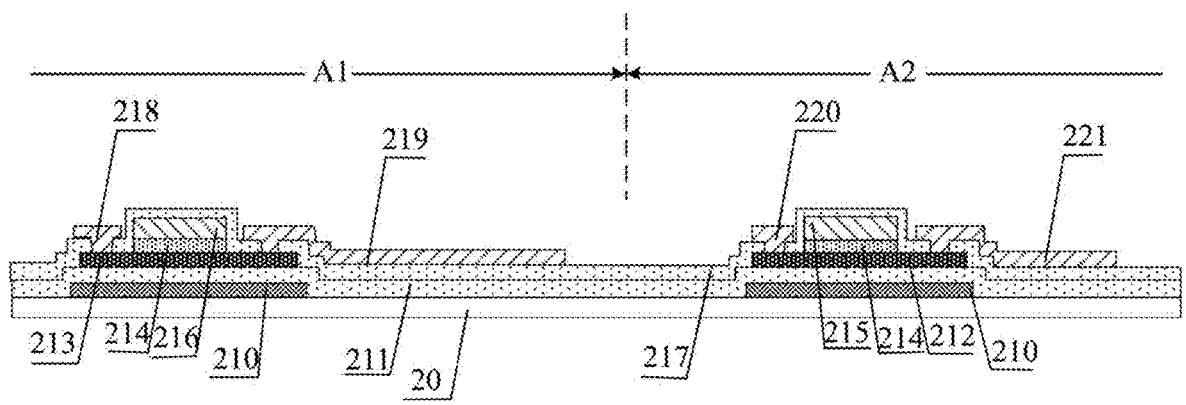
FIG. 11 is a schematic diagram after formation of patterns of a source electrode and a drain electrode according to an embodiment of the present disclosure.

Forming patterns of a source electrode and a drain electrode includes: depositing a second metal film on the substrate 20 on which the aforementioned patterns are formed, patterning the second metal film through a patterning process to form patterns of a power supply line (not shown) and a data signal wire (not shown), a reference signal wire (not shown in the figure), a first source electrode 221, a first drain electrode 220, a second source electrode 219, and a second drain electrode 218 on the third insulating layer 217, as shown in FIG. 11.

Herein, the second metal film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be a stacked structure formed by a metal and a translucent conductive material, such as indium tin oxide (ITO)/argentum (Ag)/indium tin oxide (ITO).

Figure 12:
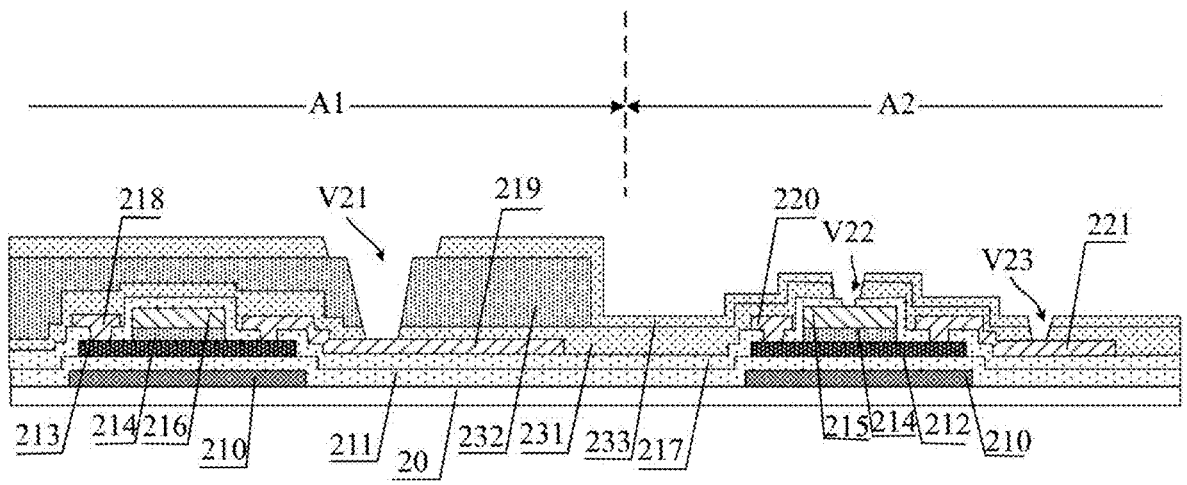
FIG. 12 is a schematic diagram after formation of a pattern of a fifth insulating layer according to an embodiment of the present disclosure.

(6) Forming Patterns of a Fourth Insulating Layer, a First Planarization Layer and a Fifth Insulating Layer Forming patterns of a fourth insulating layer, a first planarization layer, and a fifth insulating layer includes: on the substrate 20 on which the aforementioned patterns are formed, depositing a fourth insulating film in a first region A1 and a second region A2 to form a fourth insulating layer 231 covering the aforementioned structure, coating a first planarization layer in the first region A1, forming a first planarization layer 232 covering the aforementioned structure in the first region A1 through a photolithography process of masking, exposure and development, and then depositing a fifth insulating film in the first region A1 and the second region A2 to form a pattern of the fifth insulating layer 233 covering the aforementioned structure; the fifth insulating layer 233 is provided with second vias V21, V22 and V23; wherein, the second via V21 is located at the position of the second source electrode 219, and the fourth insulating layer 231, the first planarization layer 232 and the fifth insulating layer 233 in the second via V21 are removed, exposing the surface of the second source electrode 219; the second via V22 is located at the position of the first gate electrode 215, and the fifth insulating layer 233, the fourth insulating layer 231, and the third insulating layer 217 in the second via V22 are removed, exposing the surface of the first gate electrode 215; the second via V23 is located at the position of the first source electrode 221, and the fifth insulating layer 233 and the fourth insulating layer 231 in the second via V23 are removed, exposing the surface of the first source electrode 221, as shown in FIG. 12.

Herein, the fourth insulating film and the fifth insulating film may be made of silicon oxide (SiOx), silicon nitride (SiNx), silicon oxynitride (SiON), etc., or a material of High k such as aluminum oxide (AlOx), hafnium oxide (HfOx), tantalum oxide (TaOx), etc., and may be a single layer, multiple layers, or a composite layer.

The material of the first planarization film includes, but is not limited to, polysiloxane-based materials, acrylic-based materials, polyimide-based materials, and the like.

Generally, the fourth insulating layer 231 and the fifth insulating layer 233 are referred as passivation layers (PVX); the fourth insulating layer 231 is the aforementioned first passivation layer and the fifth insulating layer 233 is the aforementioned second passivation layer. By providing the fourth insulating layer 231 and the fifth insulating layer 233, the influence of the first planarization layer 232 on other films and structures may be blocked.

Figure 13:
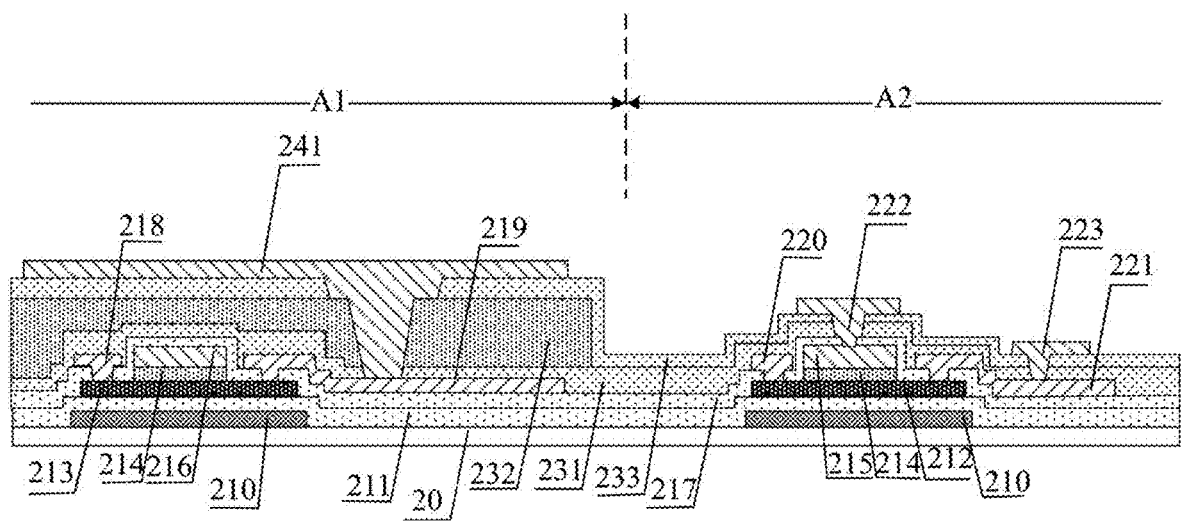
FIG. 13 is a schematic diagram after formation of a connection electrode and a pattern of a second cathode of an optical sensing element according to an embodiment of the present disclosure.

(7) Forming Patterns of a Connection Electrode and a Second Cathode of an Optical Sensing Element Forming patterns of a connection electrode and a second cathode of an optical sensing element includes: depositing a third metal film on the substrate 20 on which the aforementioned patterns are formed, and patterning the third metal film through a patterning process to form a pattern of a first connection electrode 223, a second connection electrode 222 and a second cathode 241 of an optical sensing element, as shown in FIG. 13. The first connection electrode 223 is coupled with the first source electrode 221 through the second via V23, the second connection electrode 222 is coupled with the first gate electrode 215 through the second via V22, and the second cathode 241 is coupled with the second source electrode 219 through the second via V21.

Herein, the third metal film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be a stacked structure formed by a metal and a translucent conductive material, such as indium tin oxide (ITO)/argentum (Ag)/indium tin oxide (ITO).

Through the preparation process of Acts (1) to (7), the simultaneous preparation of the thin film transistor located in the first region A1 and the second region A2 can be completed on the substrate 20. Wherein, the driving transistor M1 located in the second region A2 may include: a first active layer 212, a first gate electrode 215, a first source electrode 221, a first drain electrode 220, a first connection electrode 223, and a second connection electrode 222; and the third switch transistor M4 located in the first region A1 may include: a second active layer 213, a second gate electrode 216, a second source electrode 219 and a second drain electrode 218.

In the light-emitting detection circuit in the first region A1, the second cathode 241 of the optical sensing element may be reused as the first electrode of the second storage capacitor C2 coupled with it, and the second electrode of the second storage capacitor C2 may be prepared in the same layer with the same material as the second source electrode 219 and the second drain electrode 218 of the third switch transistor M4. According to the present embodiment, it is possible to avoid the increase of the process flow for preparing the first electrode and the second electrode of the second storage capacitor C2, simplify the preparation process of the display substrate, thus saving its preparation cost of. However, this is not limited in the embodiment of the present disclosure. The layout of the second storage capacitor may be determined according to actual needs.

In this embodiment, the first active layer 212 and the second active layer 213 are disposed in the same layer, and are simultaneously formed through the same patterning process; the first gate electrode 215 and the second gate electrode 216 are disposed in the same layer, and are simultaneously formed through the same patterning process; the first source electrode 221, the first drain electrode 220, the second source electrode 219, the second drain electrode 218, and the first electrode of the second storage capacitor are disposed in the same layer, and are simultaneously formed through the same patterning process; the first connection electrode 223, the second connection electrode 222 and the second electrode of the second storage capacitor are disposed in the same layer, and are simultaneously formed through the same patterning process.

Figure 14:
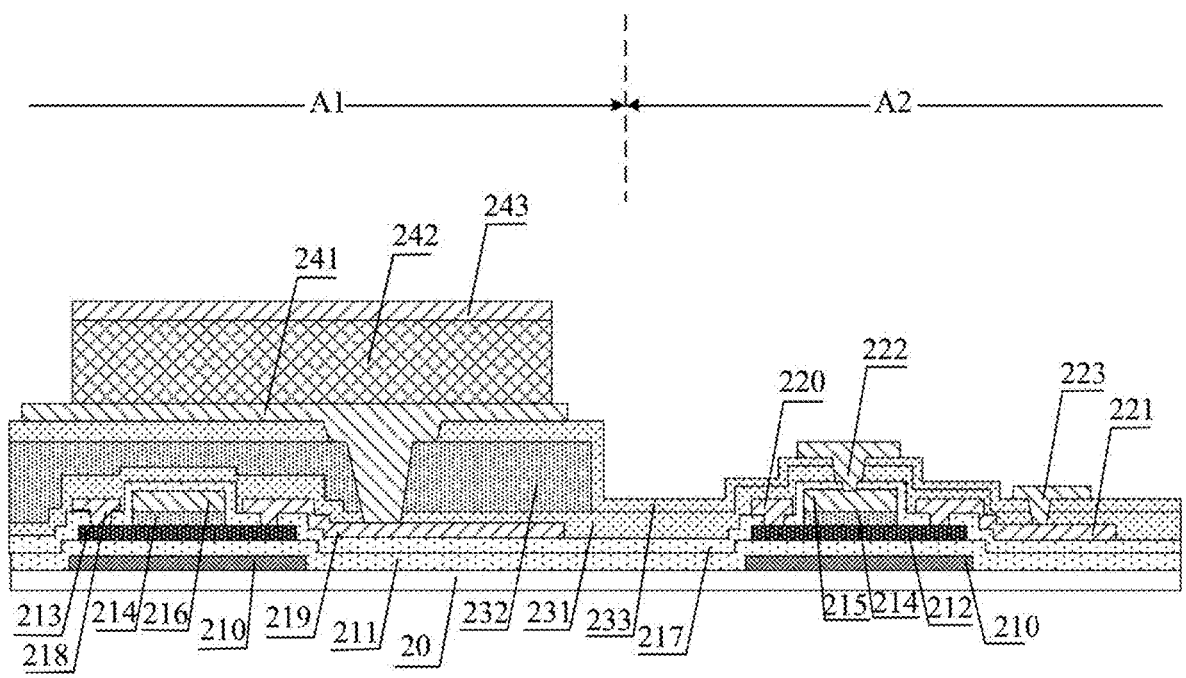
FIG. 14 is a schematic diagram after formation of a pattern of a second anode of an optical sensing element according to an embodiment of the present disclosure.

(8) Forming a Photoelectric Conversion Structure and a Pattern of a Second Anode of the Optical Sensing Element Forming a photoelectric conversion structure and a pattern of a second anode of the optical sensing element includes: in the first region A1, forming a photoelectric conversion structure 242 on the second cathode 241, depositing a first transparent conductive film on the photoelectric conversion structure 242, and patterning the first transparent conductive film through a patterning process to form a pattern of a second anode 243, as shown in FIG. 14.

In this embodiment, the optical sensing element may be a PIN type photodiode. The photoelectric conversion structure 242 includes a PN junction and a layer of I-type semiconductor with low concentration doped in the middle of the PN junction; Due to the low dopant concentration of the I-type semiconductor, which is close to a intrinsic semiconductor, it may also be referred to as an I-layer. There are P-type semiconductor and N-type semiconductor with high dopant concentration on both sides of I-layer, that is, a P-layer and a N-layer are formed. The P-layer and N-layer are very thin, and only absorb a small proportion of incident light, therefore, most of the incident light is absorbed in the I-layer, generating a large number of electron-hole pairs, while I-layer is thicker. On the other hand, the I-layer is thicker and almost occupies the entire depletion region, so that by increasing the width of the depletion region, the effect of diffusion movement can be reduced, and the response speed of the photodiode can be improved.

Herein, the first transparent conductive film may be made of indium tin oxide (ITO) or indium zinc oxide (IZO), etc.

Figure 15:
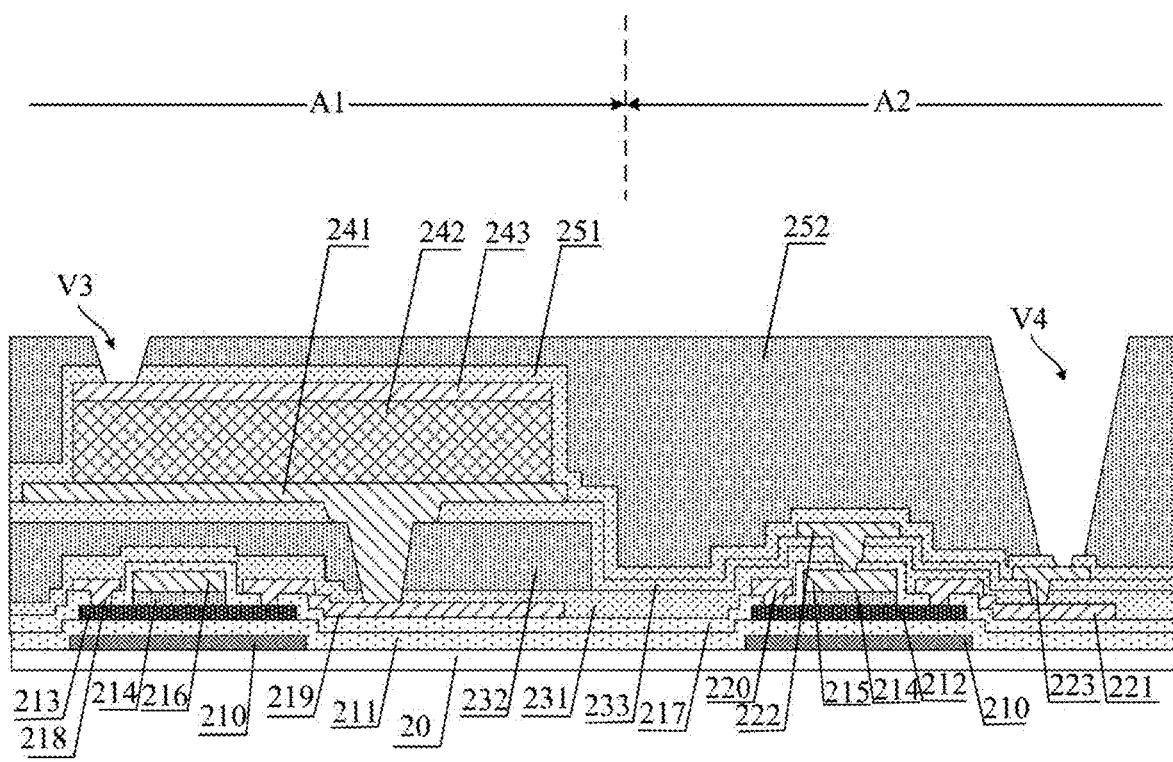
FIG. 15 is a schematic diagram after formation of a pattern of a second planarization layer according to an embodiment of the present disclosure.

(9) Forming Patterns of a Sixth Insulating Layer and a Second Planarization Layer Forming patterns of a sixth insulating layer and a second planarization layer includes: on the substrate 20 on which the aforementioned patterns are formed, first depositing a sixth insulating film to form a sixth insulating layer 251 covering the aforementioned structure, then coating a second planarization film, using the second planarization film as a photoresist, and etching the sixth insulating layer 251 through masking, exposure, and developing to form a second planarization layer 252 covering the aforementioned structure; wherein, a third via V3 and a fourth via V4 are formed on the second planarization layer 252, the third via V3 is located at the position of the second anode 243, and the sixth insulating layer 251 and the second planarization layer 252 in the third via V3 are removed, exposing the surface of the second anode 243; the fourth via V4 is located at the position of the first connection electrode 223, and the sixth insulating layer 251 and the second planarization layer 252 in the fourth via V4 are removed, exposing the surface of the first connection electrode 223, as shown in FIG. 15.

The sixth insulating film may be made of silicon oxide (SiOx), silicon nitride (SiNx) and silicon oxynitride (SiON), or may be made of a high k material such as aluminum oxide (AlOx), hafnium oxide (HfOx), tantalum oxide (TaOx), or the like, and may be of a single layer, multiple layers, or a composite layer. Generally, the sixth insulating layer may be referred to as a passivation (PVX) layer.

The material of the second planarization film includes, but is not limited to, polysiloxane-based materials, acrylic-based materials, polyimide-based materials, and the like.

(10) Forming Patterns of a First Anode and the Third Connection Electrode

Figure 16:
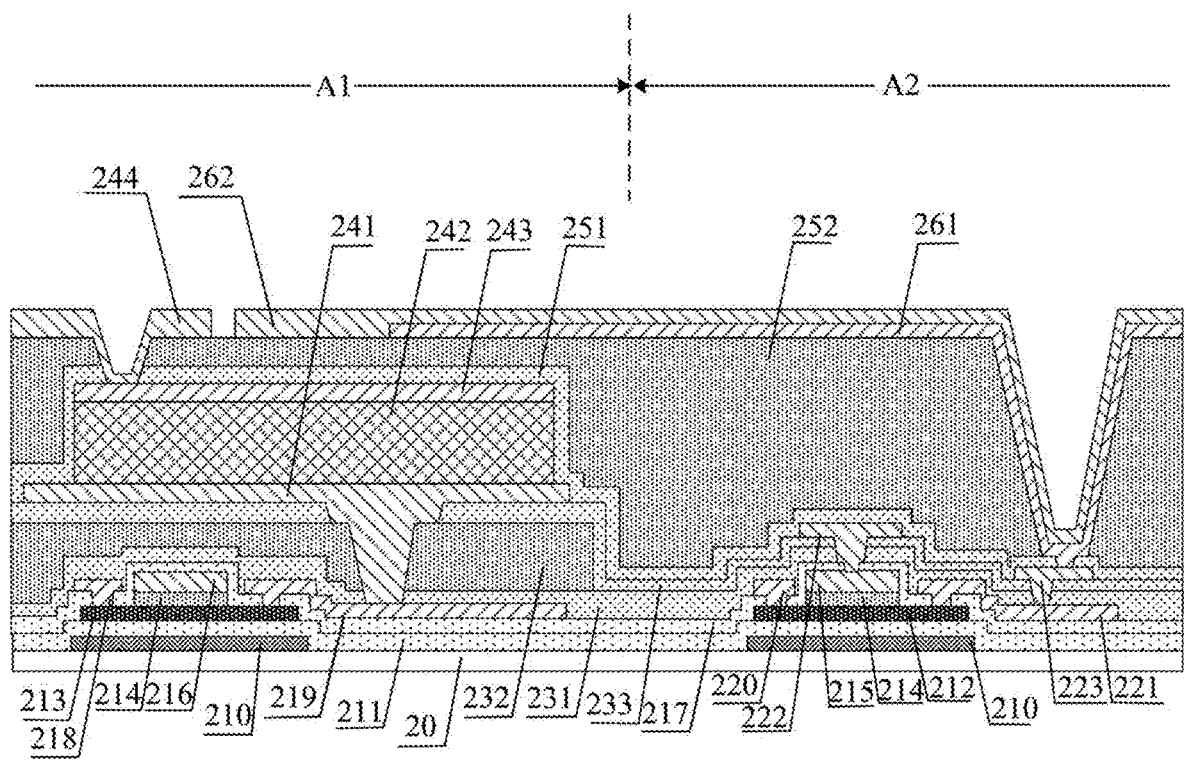
FIG. 16 is a schematic diagram after formation of a pattern of a first anode of a light-emitting element according to an embodiment of the present disclosure.

Forming patterns of a first anode and the third connection electrode includes: depositing a fourth metal film on the substrate 20 on which the aforementioned patterns are formed, and patterning the fourth metal film through a patterning process to form a pattern of a reflective layer 261; then, depositing a second transparent conductive film on the substrate 20 on which the aforementioned structures are formed, and patterning the second transparent conductive film through a patterning process to form patterns of a light transmittance layer 262 and a third connection electrode 244, as shown in FIG. 16. The third connection electrode 244 is located in the first region A1, and is coupled with the second anode 243 of the optical sensing element through the third via V3; the third connection electrode 244 may also be coupled with the second reference signal wire V2 to achieve the coupling between the second anode 243 and the second reference signal wire V2. The reflective layer 261 is coupled to the first connection electrode 223 through the fourth via V4 to achieve the coupling between the first anode of the light-emitting element and the first source electrode 221 of the driving transistor M1.

The light transmittance layer 262 and the reflective layer 261 are both of conductive materials, which can transmit the driving current provided by the first source electrode 221 of the driving transistor M1 to the light-emitting functional layer of the light-emitting element.

In this embodiment, the light transmittance layer 262 is located above the reflective layer 261, and the orthographic projection of the light transmittance layer 262 on the substrate 20 covers the orthographic projection of the reflective layer 261 on the substrate 20. An orthographic projection of the light transmittance layer 262 on the substrate 20 partially coincides with an orthographic projection of the photoelectric conversion structure 242 of the optical sensing element on the substrate 20, that is, the orthographic projection of the light transmittance layer 262 on the substrate 20 partially coincides with an orthographic projection of the photosensitive region of the optical sensing element. The light transmittance region of the light-emitting element is formed by the region of the light transmittance layer 262 that is not shielded by the reflective layer 261. In this way, a part of light emitted downward from the light-emitting element may be irradiated to the photosensitive region of the optical sensing element through the light transmittance layer 262, so that the optical sensing element may detect the luminous brightness. The rest of light emitted downward from the light-emitting element may be irradiated to the reflective layer 261 through the light transmittance layer 262, and this part of light is reflected to the light-emitting side of the light-emitting element by the reflective layer 261 for display. However, this is not limited in the embodiment of the present disclosure. In other implementations, a light transmittance region of the light-emitting element may be formed by a light transmittance layer that is not blocked by the reflective layer. In this case, the light transmittance layer may not cover the reflective layer, so that a part of light emitted downward by the light-emitting element may be irradiated to the photosensitive region of the optical sensing element through the light transmittance layer for brightness detection. The remaining light emitted downward by the light-emitting element may be directly irradiated to the reflective layer, which will be reflected by the reflective layer to the light-emitting side of the light-emitting element for display.

The fourth metal film may be made of a metal material, such as magnesium (Mg), argentum (Ag), copper (Cu), aluminum (Al), molybdenum (Mo), lithium (Li), or an alloy material of the above metals, such as aluminum neodymium alloy (AlNd), molybdenum niobium alloy (MoNb), or may be a multi-layer metal structure, such as molybdenum (Mo)/copper (Cu)/molybdenum (Mo), or may be a stacked structure formed by a metal and a transparent conductive material, such as reflective materials like ITO/Ag/ITO, Mo/AlNd/ITO.

Herein, the second transparent conductive film may be made of indium tin oxide (ITO) or indium zinc oxide (IZO), etc.

The preparation process from Act (7) to Act (10) completes the preparation of the optical sensing element, wherein the optical sensing element located in the first region A1 includes: a second cathode 241, a photoelectric conversion structure 242, a second anode 243 and a third connection electrode 244. Wherein, the third connection electrode 244 and the light-transmitting layer 262 of the first anode of the light-emitting element are disposed in the same layer, and are simultaneously formed through the same patterning process.

(11) Forming a Pattern of a Pixel Define Layer

Figure 17:
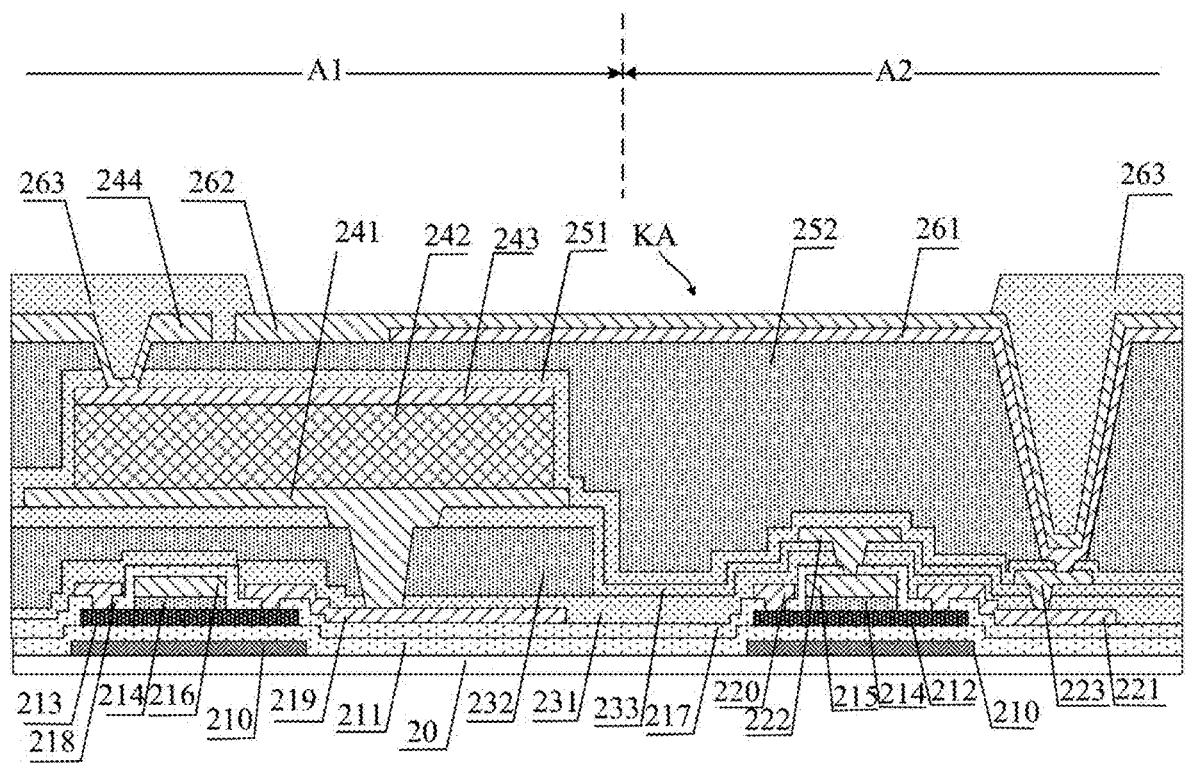
FIG. 17 is a schematic diagram after formation of a pattern of a pixel define layer according to an exemplary embodiment of the present disclosure.

Forming a pattern of a pixel define layer includes: coating a pixel define film on the substrate 20 on which the aforementioned patterns are formed, and forming a pattern of a pixel define layer 263 through masking, exposure and development, which defines an opening region KA exposing a first anode of the light transmittance layer 262, as shown in FIG. 17.

Herein, materials such as polyimide, acrylic or polyethylene terephthalate or the like may be used in the pixel define film.

(12) Forming a Pattern of a Light-Emitting Functional Layer

Figure 18:
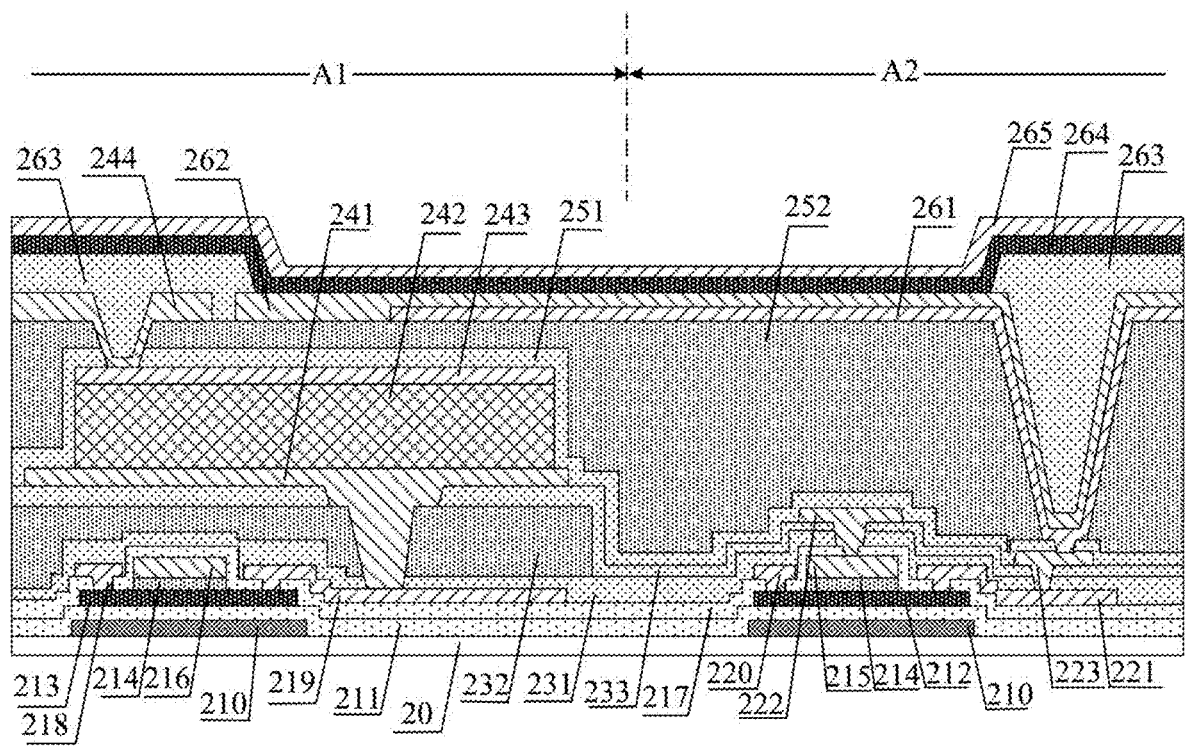
FIG. 18 is a schematic diagram after formation of a first cathode of a light-emitting element according to an embodiment of the present disclosure.

Forming a pattern of a light-emitting functional layer includes: on the substrate 20 on which the aforementioned patterns are formed, using vapor deposition or inkjet printing to form a pattern of a light-emitting functional layer 264 in the opening region KA, and the light-emitting functional layer 264 is coupled to the light transmittance layer 262 of the first anode, as shown in FIG. 18.

The light-emitting functional layer 264 includes an emitting material layer (EML). During actual implementation, the light-emitting functional layer 264 may include a hole injection layer, a hole transport layer, an emitting material layer, an electron transporting layer, and an electron injection layer sequentially disposed to improve the efficiency of electrons and hole injection into the light-emitting layer.

(13) Forming a Pattern of a First Cathode of a Light-Emitting Element.

Forming a pattern of a first cathode of a light-emitting element includes: on the substrate 20 on which the aforementioned patterns are formed, forming a first cathode 265 of the light-emitting element using vapor deposition, and the first cathode 265 is coupled to the light-emitting functional layer 264, as shown in FIG. 18.

Herein, a material of the first cathode 265 may be a transparent conductive material such as indium tin oxide (ITO) or indium zinc oxide (IZO). The light-emitting element can emit light from the side away from the substrate 20 through the transparent first cathode 265, achieving top emission.

Through the preparation processes from Act (10) to Act (13), the light-emitting element is completed, which includes a first anode (reflective layer 261 and light transmittance layer 262), a pixel define layer 263, a light-emitting functional layer 264 and a first cathode 265.

(14) Forming a Pattern of an Encapsulation Layer.

Herein, the encapsulation layer may be in a three-layer structure of inorganic/organic/inorganic to carry out the encapsulation of the display substrate It may be seen from the structure and preparation process of the display substrate in this embodiment that, the circuit structures in the first region A1 and the second region A2 are synchronously prepared on the substrate, and then the optical sensing elements are prepared in the first region A1 and the light-emitting elements are prepared in the first region A1 and the second region A2 to form a display substrate with top emission structure. In addition, the arrangement of the optical sensing element will not affect the pixel aperture ratio of the display substrate, thus greatly improving the pixel aperture ratio and display resolution of the display substrate, and makes it suitable for high PPI display, with an even lower power consumption. Furthermore, the circuit structures in the first region A1 and the second region A2 may be prepared synchronously with high integration, which simplifies the preparation process of the display substrate and saves the preparation cost.

Figure 19:
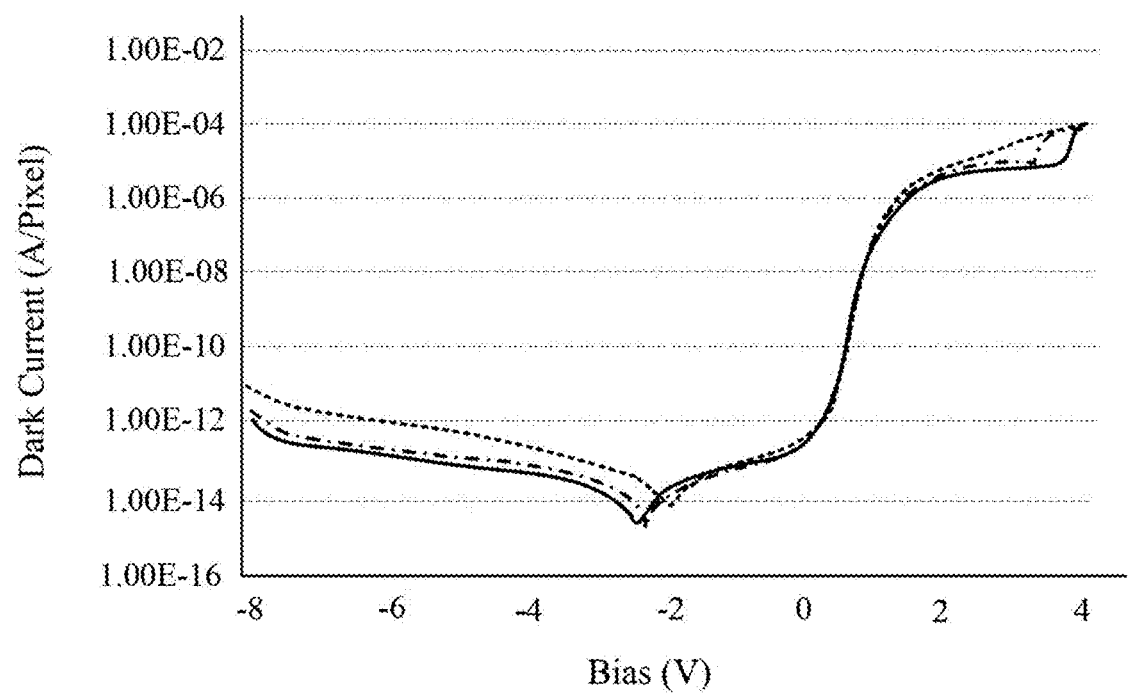
FIG. 19 is a schematic diagram showing the influence of a first planarization layer on a dark current according to an embodiment of the present disclosure.

In this embodiment, the bottom of the optical sensing element is provided with the first planarization layer, which may ensure the usability of the optical sensing element based on the high level difference at the bottom. Taking the optical sensing element being a PIN-type photodiode as an example, when the bottom level difference of PIN-type photodiode is large, the dark current will be higher. FIG. 19 is a schematic diagram showing the influence of a first planarization layer on a dark current according to an embodiment of the present disclosure. In FIG. 19, a solid line indicates that there is a first planarization layer and a pattern below the PIN-type photodiode (i.e., there is a bottom level difference), a dashed line indicates that there is no first planarization layer and no pattern below the PIN-type photodiode. As may be seen from FIG. 19, the dark current of the PIN-type photodiode is larger when there is a level difference below the PIN-type photodiode and the first planarization layer is adopted for flattening. After the first planarization layer is added below, the dark current of the PIN-type photodiode may be reduced by about 64%, which is equivalent to the case where there is no level difference below the PIN-type photodiode. It may be seen from FIG. 19 that the first planarization layer provided below the PIN-type photodiode can ensure that the characteristics of the PIN-type photodiode are available under the condition of high level difference at the bottom, and avoid affecting the accuracy of brightness signals detected by the PIN-type photodiode, thus ensuring the accuracy and effect of optical compensation.

The structure (or method) shown in the present embodiment may be appropriately combined with the structure (or method) shown in another embodiment.

Figure 20:
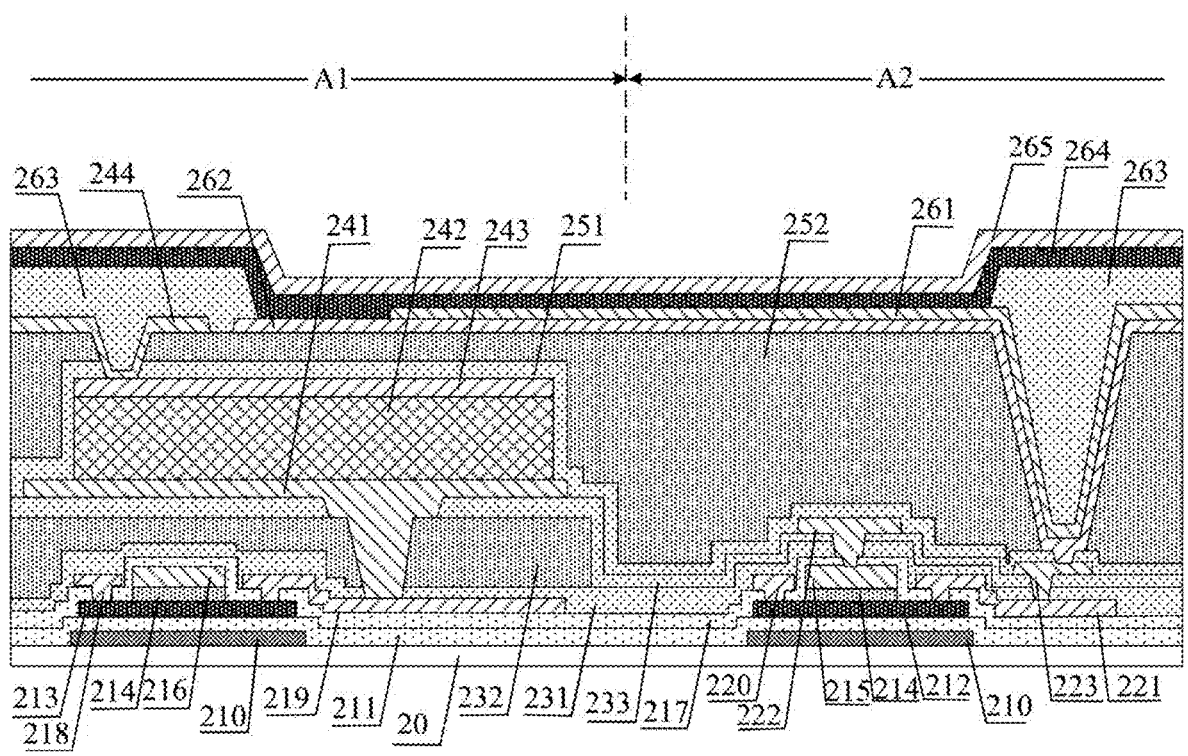
FIG. 20 is another schematic diagram of a structure of a partial sectional view of a display substrate according to an embodiment of the present disclosure.

FIG. 20 is another schematic diagram of a structure of a partial sectional view of a display substrate according to an embodiment of the present disclosure. The main structure of the display substrate provided in this embodiment is basically the same as that in the embodiment shown in FIG. 3, where the structure and preparation method of the first anode of the light-emitting element of the display substrate in this embodiment are different.

In this embodiment, the process of preparing the pixel driving circuit, the light-emitting detection circuit, a second cathode of optical sensing element, a photoelectric conversion structure, and a second anode is the same as that of the previous embodiment, which may be referred to Acts (1) to (9) of the previous embodiments.

Act (10): Forming Patterns of a First Anode and the Third Connection Electrode.

Forming patterns of a first anode and the third connection electrode includes: sequentially depositing a transparent conductive film, a metal film and a transparent conductive film on the substrate 20 on which the aforementioned patterns are formed, etching the top transparent conductive film and metal film through a patterning process to form a pattern of a reflective layer 261, and then etching the bottom transparent conductive film to form patterns of a light transmittance layer 262 and a third connection electrode 244, as shown in FIG. 20.

In this embodiment, the reflective layer 261 is located above the light transmittance layer 262, and the orthographic projection of the light transmittance layer 262 on the substrate 20 covers the orthographic projection of the reflective layer 261 on the substrate 20. An orthographic projection of the light transmittance layer 262 on the substrate 20 partially coincides with an orthographic projection of the photoelectric conversion structure 242 of the optical sensing element on the substrate 20, that is, the orthographic projection of the light transmittance layer 262 on the substrate 20 partially coincides with an orthographic projection of the photosensitive region of the optical sensing element. The light transmittance region of the light-emitting element is formed by the region of the light transmittance layer 262 that is not shielded by the reflective layer 261. In this case, a part of light emitted downward by the light-emitting element may be irradiated to the photosensitive region of the optical sensing element through the light transmittance layer 262 for brightness detection; the remaining light emitted downward by the light-emitting element may be directly irradiated to the reflective layer 261, which will be reflected by the reflective layer 261 to the light-emitting side of the light-emitting element for display.

In this embodiment, the metal film may be made of a metal material, such as magnesium (Mg), argentum (Ag), copper (Cu), aluminum (Al), molybdenum (Mo), lithium (Li), or an alloy material of the above metals, such as aluminum neodymium alloy (AlNd), molybdenum niobium alloy (MoNb), or may be a multi-layer metal structure, such as molybdenum (Mo)/copper (Cu)/molybdenum (Mo), or a stacked structure formed by a metal and a transparent conductive material, such as reflective materials like ITO/Ag/ITO, Mo/AlNd/ITO. The transparent conductive thin film may be made of indium tin oxide (ITO) or indium zinc oxide (IZO) and the like.

In this embodiment, the subsequent process of preparing other structures and encapsulation layers of the light-emitting element is the same as that of the previous embodiment, which may be referred to Acts (11) to (14) of the previous embodiments.

In this embodiment, a display substrate with a top emission structure is also achieved, and the arrangement of the optical sensing element will not affect the pixel aperture ratio of the display substrate, thus greatly improving the pixel aperture ratio and display resolution of the display substrate, and makes it suitable for high PPI display, with a even lower power consumption. Furthermore, the circuit structures in the first region A1 and the second region A2 may be prepared synchronously with high integration, which simplifies the preparation process of the display substrate and saves the preparation cost.

The structure (or method) shown in the present embodiment may be appropriately combined with the structure (or method) shown in another embodiment.

Figure 21:
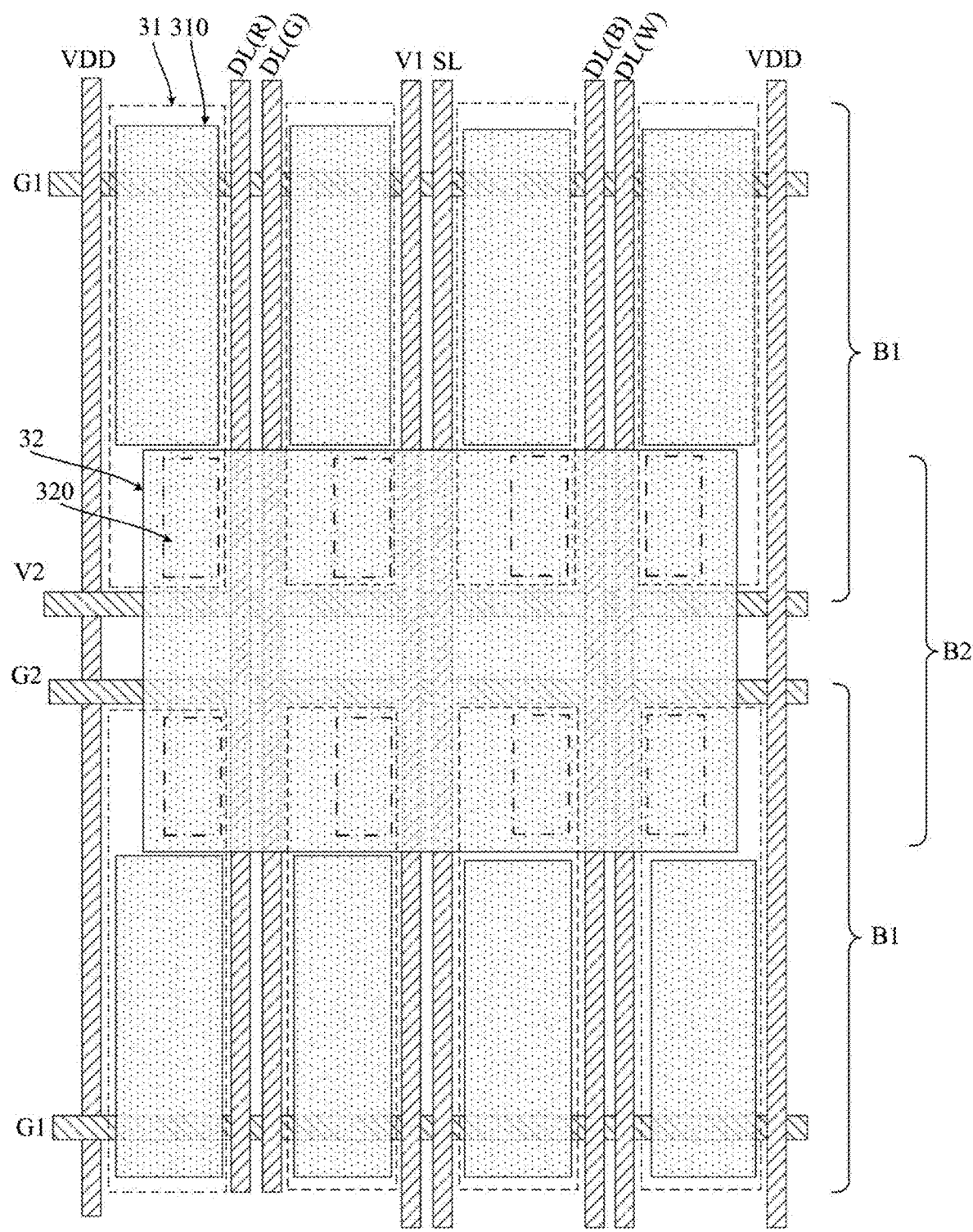
FIG. 21 is another schematic diagram of a structure of a partial top view of a display substrate according to an embodiment of the present disclosure.

FIG. 21 is a schematic diagram of a structure of a partial top view of a display substrate according to an embodiment of the present disclosure. In this embodiment, a pixel driving circuit may be shown in FIG. 4, and a light-emitting detection circuit may be shown in FIG. 5.

As shown in FIG. 21, the display substrate includes multiple scanning signal wires G1 and G2 disposed in parallel and multiple data signal wires DL and detection signal wires SL disposed in parallel, and the scanning signal wires vertically intersect with the data signal wires and detection signal wires to define multiple regularly disposed light-emitting units 31. Each pixel of the display substrate provided in this embodiment may include four light-emitting units (sub-pixels); for example, the four light-emitting units may be red sub-pixels, green sub-pixels, blue sub-pixels and white sub-pixels, respectively. However, this is not limited in the embodiment of the present disclosure. One pixel unit may include three light emitting units; for example, a red sub-pixel, a green sub-pixel, and a blue sub-pixel.

As shown in FIG. 21, from left to right, the first row of light-emitting units emits red light, corresponding to data signal wire DL(R), the second row of light-emitting units emits green light, corresponding to data signal wire DL(G), the third row of light-emitting units emits blue light, corresponding to data signal wire DL(B), and the fourth row of light-emitting units emits white light, corresponding to data signal wire DL(W).

As shown in FIG. 21, on a plane parallel to the display substrate, the main structure of the display substrate includes a light-emitting region B1 and a light detection region B2, and the light-emitting region B1 and the light detection region B2 partially coincide. The light-emitting region B1 may include multiple light-emitting units 31 disposed in an array, and the multiple light-emitting units 31 are configured to emit light from a side away from the substrate to achieve display, and each light-emitting unit 31 includes a pixel driving circuit 310 and a light-emitting element; the light detection region B2 includes a light-detecting unit 32 configured to detect the intensity of light emitted from the light-emitting unit 31 to perform brightness compensation on the light-emitting unit 31 according to the detected brightness signal.

As shown in FIG. 21, eight light-emitting units 31 disposed in an array (regularly disposed in two rows and four columns) reuse one light-detecting unit 32, and an orthographic projection of the optical sensing element of the light-detecting unit 32 on the substrate coincides with an orthographic projection of the light transmittance region of the light-emitting element of the eight light-emitting units 31, so that one optical sensing element may respectively receive the light emitted by the eight light-emitting elements, thereby achieving brightness detection and optical compensation for each light-emitting element. As shown in FIG. 21, the coinciding region between the orthographic projection of the light transmittance region of a light-emitting element on the substrate and the orthographic projection of the optical sensing element of the light-detecting unit 32 is the photosensitive region 320 of the optical sensing element on the light-emitting element. The size of the photosensitive regions 320 of the eight light-emitting units 31 may be the same for the light-detecting unit 32. However, this is not limited in the embodiment of the present disclosure.

In this embodiment, multiple light-emitting units may reuse the same light-detecting unit, so that the area occupied by the light-detecting unit in the display substrate is further reduced, which is more conducive to improving the pixel aperture ratio of the display substrate. Furthermore, the number of optical sensing elements in the display substrate may be reduced, thereby further reducing the dark current of the light-emitting detection circuit.

Figure 22:
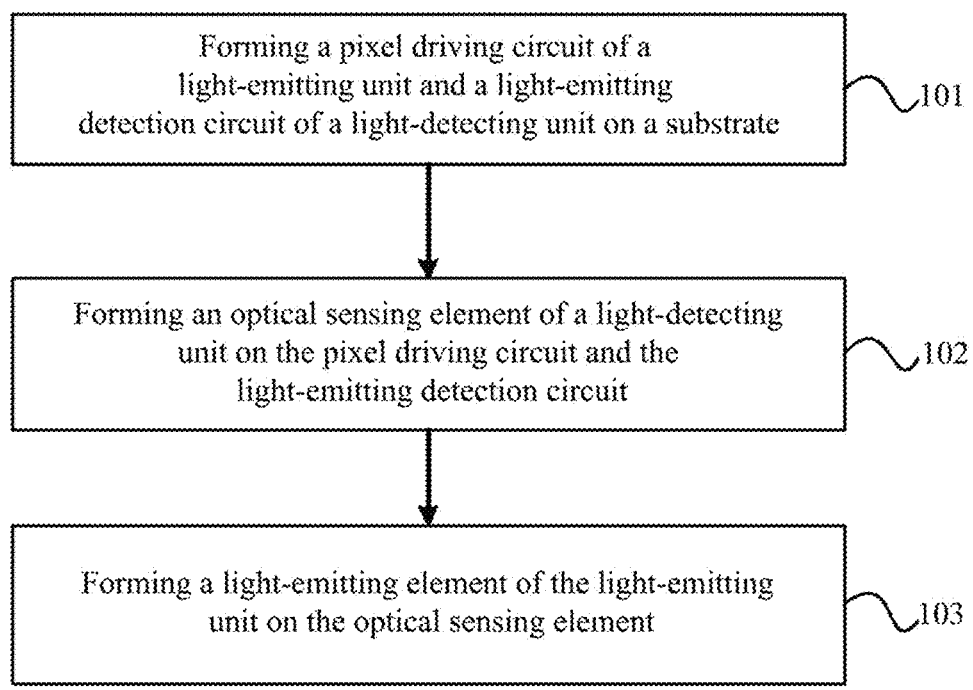
FIG. 22 is a flowchart of a preparation method of a display substrate according to an embodiment of the present disclosure.

FIG. 22 is a flowchart of a preparation method of a display substrate according to an embodiment of the present disclosure. As shown in FIG. 22, a method for preparing a display substrate provided by an embodiment of the present disclosure includes:

Act 101: Forming a pixel driving circuit of a light-emitting unit and a light-emitting detection circuit of a light-detecting unit on a substrate;

Act 102: Forming an optical sensing element of a light-detecting unit on the pixel driving circuit and the light-emitting detection circuit, wherein the optical sensing element is coupled with the light-emitting detection circuit;

Act 103: Forming a light-emitting element of the light-emitting unit on the optical sensing element, wherein the light-emitting element is coupled with the pixel driving circuit; the light-emitting element emits light from a side away from the substrate, a light transmittance region is provided on one side of the light-emitting element facing the optical sensing element, and an orthographic projection of the light transmittance region on the substrate at least partially coincides with an orthographic projection of the optical sensing element on the substrate.

In an exemplary embodiment, an orthographic projection of a light transmitting region on a substrate completely coincides with an orthographic projection of an optical sensing element on the substrate.

In an exemplary embodiment, forming a light-emitting element of a light-emitting unit on an optical sensing element may include: sequentially forming a first anode, a light-emitting functional layer and a first cathode which are stacked on the optical sensing element, wherein the first cathode is made of light transmittance material, and the first anode includes a reflective layer and a light transmittance layer which are stacked, and an orthographic projection of a light transmittance layer on a substrate covers an orthographic projection of a reflective layer on the substrate, and a region of the light transmittance layer not shielded by the reflective layer forms a light transmittance region.

In an exemplary embodiment, after forming the pixel driving circuit of the light-emitting unit and the light-emitting detection circuit of the light-detecting unit on the substrate, the preparation method of the present embodiment may further include: forming a first planarization layer on the light-emitting detection circuit;

the forming of the optical sensing element of the light-detecting unit on the pixel driving circuit and the light-emitting detection circuit may include forming the optical sensing element on the first planarization layer.

In an exemplary embodiment, the preparation method of this embodiment may further include: forming a first passivation layer between a light-emitting detection circuit and a first planarization layer; and forming a second passivation layer between the first planarization layer and an optical sensing element.

The process for preparing the display substrate has been described in detail in the previous embodiments and will not be repeated here.

The preparation method of the display substrate in this embodiment also achieves a display substrate with a top emission structure; the arrangement of the optical sensing element will not affect the pixel aperture ratio of the display substrate, thus greatly improving the pixel aperture ratio and display resolution of the display substrate, and makes it suitable for high PPI display, with an even lower power consumption. Furthermore, the pixel driving circuit and the light-emitting detection circuit may be prepared synchronously with high integration, which simplifies the preparation process of the display substrate and saves the preparation cost.

An embodiment of the present disclosure further provides a display apparatus, including the display substrate described above. The display apparatus may be any product or component with a display function, such as a mobile phone, a tablet computer, a television, a display, a laptop computer, a digital photo frame, a navigator, etc., and the embodiments of the present disclosure are not limited thereto.

Although the embodiments disclosed in the present disclosure are as described above, the described contents are only the embodiments for facilitating understanding of the present disclosure, which are not intended to limit the present disclosure. Any person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

We claim:

1. A display substrate, comprising: a substrate, and a plurality of light-emitting units and a plurality of light-detecting units located on the substrate; wherein
    at least one light-emitting unit comprises a light-emitting element and a pixel driving circuit coupled with the light-emitting element, and at least one light-detecting unit comprises an optical sensing element and a light-emitting detection circuit coupled with the optical sensing element;
    the optical sensing element is located on one side of the light-emitting detection circuit and the pixel driving circuit away from the substrate and between the light-emitting element and the substrate; and
    the light-emitting element emits light from a side away from the substrate, a light transmittance region is provided on one side of the light-emitting element facing the optical sensing element, and an orthographic projection of the light transmittance region on the substrate at least partially coincides with an orthographic projection of the optical sensing element on the substrate,
    wherein the display substrate further comprises:
    a first planarization layer located between the optical sensing element and the light-emitting detection circuit; and
    a first passivation layer and a second passivation layer; wherein the first passivation layer is located between the light-emitting detection circuit and the first planarization layer, and the second passivation layer is located between the first planarization layer and the optical sensing element.

2. A display apparatus, comprising the display substrate according to claim 1.

3. The display substrate according to claim 1, wherein an orthographic projection of the light transmitting region on the substrate completely coincides with an orthographic projection of the optical sensing element on the substrate.

4. A display apparatus, comprising the display substrate according to claim 3.

5. The display substrate according to claim 1, wherein the optical sensing element comprise a second cathode, a photoelectric conversion structure, and a second anode which are sequentially stacked along a direction away from the substrate;

wherein the second cathode is made of light-shielding material, and the second anode is made of light-transmitting material.

6. A display apparatus, comprising the display substrate according to claim 5.

7. The display substrate according to claim 1, wherein the plurality of light-emitting units and the plurality of light-detecting units have a one-to-one correspondence or a plurality of-to-one correspondence.

8. The display substrate according to claim 7, wherein eight light-emitting units disposed in an array reuse one light detection unit.

9. A method for preparing the display substrate according to claim 1, comprising:

forming the pixel driving circuit of the plurality of light-emitting units and the light-emitting detection circuit of the plurality of light-detecting units on the substrate;

forming the optical sensing element of the plurality of light-detecting units on the pixel driving circuit and the light-emitting detection circuit, wherein the optical sensing element is coupled with the light-emitting detection circuit; and forming the light-emitting element of the plurality of light-emitting units on the optical sensing element;

wherein the light-emitting element is coupled with the pixel driving circuit, the light-emitting element emits light from a side away from the substrate, the light transmittance region is provided on one side of the light-emitting element facing the optical sensing element, and an orthographic projection of the light transmittance region on the substrate at least partially coincides with an orthographic projection of the optical sensing element on the substrate.

10. The preparation method according to claim 9, wherein the forming a light-emitting element of the light-emitting unit on the optical sensing element comprises:

sequentially forming a first anode, a light-emitting functional layer and a first cathode which are stacked on the optical sensing element, wherein the first cathode is made of light transmittance material, the first anode comprises a reflective layer and a light transmittance layer which are stacked, and an orthographic projection of the light transmittance layer on the substrate covers an orthographic projection of the reflective layer on the substrate, and a region of the light transmittance layer not shielded by the reflective layer forms the light transmittance region.

11. The display substrate according to claim 1, wherein the light-emitting element comprises a first anode, a light-emitting functional layer, and a first cathode which are sequentially stacked in a direction away from the substrate;

the first cathode is made of light transmittance material; and the first anode comprises a reflective layer and a light transmittance layer, and the light transmittance region is formed by the light transmittance layer and the reflective layer.

12. A display apparatus, comprising the display substrate according to claim 11.

13. The display substrate according to claim 11, wherein an orthographic projection of the light transmittance layer on the substrate covers an orthographic projection of the reflective layer on the substrate, and a region of the light transmittance layer not shielded by the reflective layer forms the light transmittance region.

14. A display apparatus, comprising the display substrate according to claim 13.

15. The display substrate according to claim 11, wherein the light transmittance layer is located on one side of the reflective layer away from the substrate, or the reflective layer is located on one side of the light transmittance layer away from the substrate.

16. A display apparatus, comprising the display substrate according to claim 15.

\* \* \* \* \*